(12) United States Patent
Koda et al.

(10) Patent No.: US 11,958,951 B2
(45) Date of Patent: Apr. 16, 2024

(54) RESIN COMPOSITION, PREPREG, RESIN-EQUIPPED FILM, RESIN-EQUIPPED METAL FOIL, METAL-CLADDED LAYERED SHEET, AND WIRING BOARD

(71) Applicant: PANASONIC INTELLECTUAL PROPERTY MANAGEMENT CO., LTD., Osaka (JP)

(72) Inventors: Masashi Koda, Fukushima (JP); Yuki Kitai, Osaka (JP); Atsushi Wada, Osaka (JP); Yasunori Hoshino, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 1 day.

(21) Appl. No.: 17/632,038

(22) PCT Filed: Jul. 30, 2020

(86) PCT No.: PCT/JP2020/029360
§ 371 (c)(1),
(2) Date: Feb. 1, 2022

(87) PCT Pub. No.: WO2021/024923
PCT Pub. Date: Feb. 11, 2021

(65) Prior Publication Data
US 2022/0275122 A1 Sep. 1, 2022

(30) Foreign Application Priority Data

Aug. 7, 2019 (JP) .................................. 2019-145498

(51) Int. Cl.
*C08L 25/08* (2006.01)
*B32B 5/02* (2006.01)
(Continued)

(52) U.S. Cl.
CPC ............... *C08J 5/244* (2021.05); *B32B 5/024* (2013.01); *B32B 5/263* (2021.05); *B32B 15/14* (2013.01);
(Continued)

(58) Field of Classification Search
CPC .......... C08L 25/08; C08L 25/16; C08L 71/12; C08L 71/126; C08K 3/36
See application file for complete search history.

(56) References Cited

U.S. PATENT DOCUMENTS 11,691,885 B2 * 7/2023 Omokawa ............. C01B 33/152
430/108.7
2017/0099731 A1 4/2017 Arisawa et al.
(Continued)

FOREIGN PATENT DOCUMENTS

JP 2004107204 A * 4/2004 ........... C01B 33/141
JP 2007-262191 10/2007
(Continued)

OTHER PUBLICATIONS

JP 2018-168347 A (Nov. 1, 2018); machine translation. (Year: 2018).*
(Continued)

*Primary Examiner* — Rip A Lee
(74) *Attorney, Agent, or Firm* — GREENBLUM & BERNSTEIN, P.L.C.

(57) ABSTRACT

A resin composition is provided containing a polymer having a structural unit represented by the following Formula (1) in the molecule, and an inorganic filler, in which the inorganic filler contains silica in which a ratio of a number of Si atoms contained in silanol groups to a total number of Si atoms is 3% or less.

(Continued)

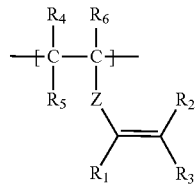

(1)

In Formula (1), Z represents an arylene group, $R_1$ to $R_3$ each independently represent a hydrogen atom or an alkyl group, and $R_4$ to $R_6$ each independently represent a hydrogen atom or an alkyl group having 1 to 6 carbon atoms.

19 Claims, 6 Drawing Sheets

(51) Int. Cl.
| | |
|---|---|
| *B32B 5/26* | (2006.01) |
| *B32B 15/14* | (2006.01) |
| *B32B 15/20* | (2006.01) |
| *C08F 212/08* | (2006.01) |
| *C08J 5/18* | (2006.01) |
| *C08J 5/24* | (2006.01) |
| *C08K 3/36* | (2006.01) |
| *C08L 25/10* | (2006.01) |
| *C08L 71/12* | (2006.01) |
| *H05K 1/03* | (2006.01) |
| *C08L 25/16* | (2006.01) |

(52) U.S. Cl.
CPC ............ *B32B 15/20* (2013.01); *C08F 212/08* (2013.01); *C08J 5/18* (2013.01); *C08J 5/249* (2021.05); *C08K 3/36* (2013.01); *C08L 25/10* (2013.01); *H05K 1/0353* (2013.01); *B32B 2260/023* (2013.01); *B32B 2260/046* (2013.01); *B32B 2262/101* (2013.01); *B32B 2307/204* (2013.01); *B32B 2307/726* (2013.01); *B32B 2457/08* (2013.01); *C08F 2800/10* (2013.01); *C08F 2800/20* (2013.01); *C08J 2325/10* (2013.01); *C08J 2471/12* (2013.01); *C08L 25/08* (2013.01); *C08L 25/16* (2013.01); *C08L 71/12* (2013.01); *C08L 71/126* (2013.01)

(56) References Cited

U.S. PATENT DOCUMENTS

| | | | | |
|---|---|---|---|---|
| 2017/0226302 | A1* | 8/2017 | Saito | C08K 5/49 |
| 2021/0371666 | A1* | 12/2021 | Shiobara | C08L 63/00 |
| 2022/0275122 | A1* | 9/2022 | Koda | C08J 5/249 |
| 2022/0289969 | A1* | 9/2022 | Koda | C08G 65/485 |

FOREIGN PATENT DOCUMENTS

| | | | | |
|---|---|---|---|---|
| JP | 2011-068526 | | 4/2011 | |
| JP | 2012-104616 | | 5/2012 | |
| JP | 2016-056367 | | 4/2016 | |
| JP | 2016-121044 A | * | 7/2016 | ............ C01B 33/12 |
| JP | 2016-147986 | | 8/2016 | |
| JP | 2018-039995 | | 3/2018 | |
| JP | 2018-168347 | | 11/2018 | |
| JP | 2018-168347 A | * | 11/2018 | ............ C08F 299/02 |
| KR | 10-2008-0076834 A | * | 8/2008 | ............ H01L 21/31 |
| WO | WO-2019049907 A1 | * | 3/2019 | ........... C01B 33/152 |

OTHER PUBLICATIONS

JP 2016-121044 A (Jul. 7, 2016); machine translation. (Year: 2016).*

ISR issued in WIPO Patent Application No. PCT/JP2020/029360, dated Oct. 20, 2020, English translation.

* cited by examiner

RESIN COMPOSITION, PREPREG, RESIN-EQUIPPED FILM, RESIN-EQUIPPED METAL FOIL, METAL-CLADDED LAYERED SHEET, AND WIRING BOARD

TECHNICAL FIELD

The present invention relates to a resin composition, a prepreg, a film with resin, a metal foil with resin, a metal-clad laminate, and a wiring board.

BACKGROUND ART

As the information processing quantity by various kinds of electronic equipment increases, mounting technologies such as high integration of semiconductor devices to be mounted, densification of wiring, and multi-layering are progressing. In addition, wiring boards to be used in various kinds of electronic equipment are required to be, for example, high-frequency compatible wiring boards such as a millimeter-wave radar board for in-vehicle use. Wiring boards to be used in various kinds of electronic equipment are required to decrease the loss during signal transmission in order to increase the signal transmission speed, and this is especially required for high-frequency wiring boards. In order to meet this requirement, substrate materials for forming substrates of wiring boards to be used in various kinds of electronic equipment are required to have a low dielectric constant and a low dielectric loss tangent.

Meanwhile, molding materials such as substrate materials are required to exhibit not only excellent low dielectric properties but also excellent heat resistance and the like. From this fact, it is considered that the resin contained in the substrate material is modified so as to be polymerized together with a curing agent and the like and, for example, a vinyl group and the like are introduced thereinto to improve the heat resistance.

Examples of such substrate materials include the composition described in Patent Literature 1. Patent Literature 1 describes a curable composition containing a radical polymerizable compound having unsaturated bonds in the molecule, a predetermined amount of an inorganic filler containing a metal oxide, and a predetermined amount of a dispersant having an acidic group and a basic group, in which the content of the metal oxide is 80 parts by mass or more and 100 parts by mass or less with respect to 100 parts by mass of the inorganic filler. According to Patent Literature 1, it is disclosed that a curable composition, which can suitably provide a cured product exhibiting excellent dielectric properties and heat resistance and a small coefficient of thermal expansion, can be obtained.

CITATION LIST

Patent Literature

Patent Literature 1: JP 2016-56367 A

SUMMARY OF INVENTION

An object of the present invention is to provide a resin composition providing a cured product which exhibits low dielectric properties and high heat resistance and can suitably maintain the low dielectric properties even after a water absorption treatment. Another object of the present invention is to provide a prepreg, a film with resin, a metal foil with resin, a metal-clad laminate, and a wiring board which are obtained using the resin composition.

An aspect of the present invention is a resin composition containing a polymer having a structural unit represented by the following Formula (1) in the molecule, and an inorganic filler, in which the inorganic filler contains silica in which a ratio of a number of Si atoms contained in silanol groups to a total number of Si atoms is 3% or less.

[Chem. 1]

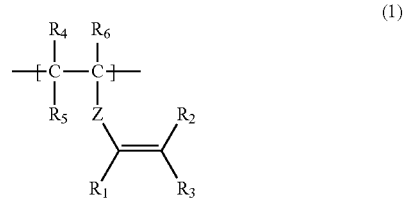

In Formula (1), Z represents an arylene group, $R_1$ to $R_3$ each independently represent a hydrogen atom or an alkyl group, and $R_4$ to $R_6$ each independently represent a hydrogen atom or an alkyl group having 1 to 6 carbon atoms.

Another aspect of the present invention is a resin composition containing a polymer having a structural unit represented by Formula (1) in a molecule, and an inorganic filler containing silica, in which a ratio of a number of Si atoms contained in the silanol groups to a total number of Si atoms is 3% or less in the inorganic filler extracted from the resin composition or a semi-cured product of the resin composition.

DESCRIPTION OF EMBODIMENTS

Figure 1:
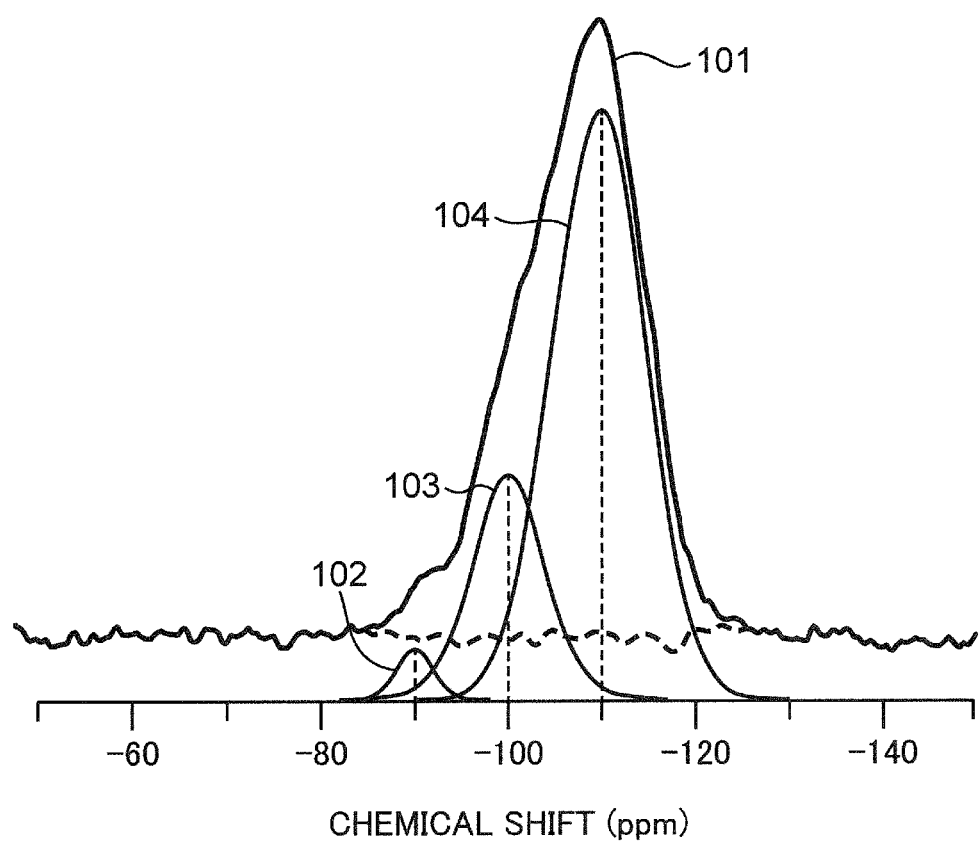
FIG. 1 is a view illustrating an example of a solid-state $^{29}$Si-NMR spectrum of silica.

It is considered that a wiring board obtained using a resin composition exhibiting low dielectric properties such as dielectric constant and dielectric loss tangent as described in Patent Literature 1 can decrease the loss during signal transmission, and the present inventors have paid attention to this. The present inventors have paid attention to the fact that it is required that the signal transmission speed on the wiring board is further increased and the wiring board is hardly affected by the changes in the external environment and the like. Substrate materials for forming substrates of wiring boards are required to provide cured products exhibiting excellent heat resistance, for example, so that the wiring boards can be used even in an environment in which the temperature is high. Substrates of wiring boards are required to maintain the low dielectric properties even if they absorb water so that the wiring boards can be used even in an environment in which the humidity is high. For this reason, substrate materials for forming substrates of wiring boards are required to provide a cured product which sufficiently suppresses the increases in dielectric constant and dielectric loss tangent due to water absorption, namely, a cured product which can suitably maintain the low dielectric properties even after a water absorption treatment.

As a result of extensive studies, the present inventors have found out that the object to provide a resin composition providing a cured product which exhibits low dielectric properties and high heat resistance and can suitably maintain the low dielectric properties even after a water absorption treatment is achieved by the following present invention.

In order that the obtained cured product exhibits low dielectric properties and the low dielectric properties are maintained even after a water absorption treatment, the present inventors have conducted studies by paying attention to the components contained in the resin composition. According to the studies by the present inventors, it has been found that the maintenance of the low dielectric properties and the like are affected by the amount of silanol groups present in silica that is an inorganic filler contained in the resin composition. As a result of extensive studies, the present inventors have found out the present invention as described later by paying attention to the amount of silanol groups present in silica as an inorganic filler.

Hereinafter, embodiments according to the present invention will be described, but the present invention is not limited thereto.

[Resin Composition]

An aspect of the present invention is a resin composition containing a polymer having a structural unit represented by the following Formula (1) in the molecule, and an inorganic filler, in which the inorganic filler contains silica in which the ratio of the number of Si atoms contained in the silanol groups to the total number of Si atoms is 3% or less.

[Chem. 2]

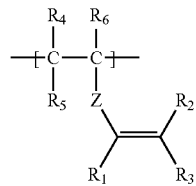

(1)

In Formula (1), Z represents an arylene group, $R_1$ to $R_3$ each independently represent a hydrogen atom or an alkyl group, and $R_4$ to $R_6$ each independently represent a hydrogen atom or an alkyl group having 1 to 6 carbon atoms.

As described above, in the silica, the ratio of the number of Si atoms contained in the silanol groups to the total number of Si atoms is 3% or less. In other words, the Si atoms constituting the silanol groups contained in the silica are 3% or less of the total Si atoms contained in the silica. By containing silica having a small number of silanol groups as described above in a resin composition containing the polymer as an inorganic filler, a resin composition is obtained which provides a cured product which exhibits low dielectric properties and high heat resistance and can suitably maintain the low dielectric properties even after a water absorption treatment. This is considered to be due to the following.

First, the cured product obtained by curing a resin composition containing the polymer is considered to exhibit excellent heat resistance and low dielectric properties. By using an inorganic filler containing the silica as the inorganic filler contained in the resin composition, the cured product of the resin composition is considered to exhibit low dielectric properties and can suitably maintain the low dielectric properties even after a water absorption treatment. From these facts, it is considered that the resin composition is a resin composition providing a cured product which exhibits low dielectric properties and high heat resistance and can suitably maintain the low dielectric properties even after a water absorption treatment.

(Polymer)

The polymer is not particularly limited as long as it is a polymer having the structural unit represented by Formula (1) in the molecule. The polymer may have a structural unit other than the structural unit represented by Formula (1) as long as it is a polymer having the structural unit represented by Formula (1) in the molecule. The polymer may include a repeating unit in which the structural unit represented by Formula (1) is repeatedly bonded, or the polymer may be a polymer in which a repeating unit in which the structural unit represented by Formula (1) is repeatedly bonded and a repeating unit in which a structural unit other than the structural unit represented by Formula (1) is repeatedly bonded are randomly bonded. In other words, the polymer may be a block copolymer or a random copolymer when the polymer has a structural unit other than the structural unit represented by Formula (1).

The arylene group represented by Z in Formula (1) is not particularly limited. Examples of this arylene group include a monocyclic aromatic group such as a phenylene group, and a polycyclic aromatic group in which the aromatic is not a single ring but a polycyclic aromatic such as a naphthalene ring. This arylene group also includes a derivative in which a hydrogen atom bonded to an aromatic ring is substituted with a functional group such as an alkenyl group, an alkynyl group, a formyl group, an alkylcarbonyl group, an alkenylcarbonyl group, or an alkynylcarbonyl group.

The alkyl group represented by $R_1$ to $R_3$ in Formula (1) is not particularly limited, and for example, an alkyl group having 1 to 18 carbon atoms is preferable and an alkyl group having 1 to 10 carbon atoms is more preferable. Specific examples thereof include a methyl group, an ethyl group, a propyl group, a hexyl group, and a decyl group.

The alkyl group having 1 to 6 carbon atoms, which is represented by $R_4$ to $R_6$ in Formula (1), is not particularly limited, and specific examples thereof include a methyl group, an ethyl group, a propyl group, and a hexyl group.

It is preferable that the polymer includes an aromatic polymer having a structural unit derived from a bifunctional aromatic compound in which two carbon-carbon unsaturated double bonds are bonded to an aromatic ring as the structural unit represented by Formula (1). The structural unit derived from a bifunctional aromatic compound is a structural unit obtained by polymerizing the bifunctional aromatic compound. In the present specification, the aromatic polymer is also referred to as a divinyl aromatic polymer.

The bifunctional aromatic compound is not particularly limited as long as it is a bifunctional aromatic compound in which two carbon-carbon unsaturated double bonds are bonded to an aromatic ring. Examples of the bifunctional aromatic compound include m-divinylbenzene, p-divinylbenzene, 1,2-diisopropenylbenzene, 1,3-diisopropenylbenzene, 1,4-diisopropenylbenzene, 1,3-divinylnaphthalene, 1,8-divinylnaphthalene, 1,4-divinylnaphthalene, 1,5-divinylnaphthalene, 2,3-divinylnaphthalene, 2,7-divinylnaphthalene, 2,6-divinylnaphthalene, 4,4'-divinylbiphenyl, 4,3'-divinylbiphenyl, 4,2'-divinylbiphenyl, 3,2'-divinylbiphenyl, 3,3'-divinylbiphenyl, 2,2'-divinylbiphenyl, 2,4-divinylbiphenyl, 1,2-divinyl-3,4-dimethylbenzene, 1,3-divinyl-4,5,8-tributylnaphthalene, and 2,2'-divinyl 4-ethyl-4'-propylbiphenyl. These may be used singly or in combination of two or more kinds thereof. Among these, the bifunctional aromatic compound is preferably divinylbenzene such as m-divinylbenzene and p-divinylbenzene, more preferably p-divinylbenzene.

The aromatic polymer may have not only a structural unit derived from the bifunctional aromatic compound but also another structural unit. Examples of the other structural unit include a structural unit derived from a monofunctional aromatic compound in which one carbon-carbon unsaturated double bond is bonded to an aromatic ring, a structural unit derived from a trifunctional aromatic compound in which three carbon-carbon unsaturated double bonds are bonded to an aromatic ring, structural units derived from indenes, and structural units derived from acenaphthylenes. The structural unit derived from a monofunctional aromatic compound is a structural unit obtained by polymerizing the monofunctional aromatic compound. The structural unit derived from a trifunctional aromatic compound is a structural unit obtained by polymerizing the trifunctional aromatic compound. The structural units derived from indenes are structural units obtained by polymerizing indenes. The structural units derived from acenaphthylenes are structural units obtained by polymerizing acenaphthylenes.

In the monofunctional aromatic compound, it is only required that one carbon-carbon unsaturated double bond is bonded to an aromatic ring, and a group other than the carbon-carbon unsaturated double bond may be bonded to the aromatic ring. Examples of the monofunctional aromatic compound include a monofunctional aromatic compound in which one carbon-carbon unsaturated double bond is bonded to an aromatic ring and a group other than this carbon-carbon unsaturated double bond is not bonded the aromatic ring and a monofunctional aromatic compound in which one carbon-carbon unsaturated double bond is bonded to an aromatic ring and an alkyl group such as an ethyl group is further bonded to the aromatic ring.

Examples of the monofunctional aromatic compound in which one carbon-carbon unsaturated double bond is bonded to an aromatic ring and a group other than this carbon-carbon unsaturated double bond is not bonded the aromatic ring include styrene, 2-vinylbiphenyl, 3-vinylbiphenyl, 4-vinylbiphenyl, 1-vinylnaphthalene, 2-vinylnaphthalene, and α-alkyl-substituted styrene. Examples of the α-alkyl-substituted styrene include α-methylstyrene, α-ethylstyrene, α-propylstyrene, α-n-butylstyrene, α-isobutylstyrene, α-t-butylstyrene, α-n-pentylstyrene, α-2-methylbutylstyrene, α-3-methylbutyl-2-styrene, α-t-butylstyrene, α-t-butylstyrene, α-n-pentylstyrene, α-2-methylbutylstyrene, α-3-methylbutylstyrene, α-t-pentylstyrene, α-n-hexylstyrene, α-2-methylpentylstyrene, α-3-methylpentylstyrene, α-1-methylpentylstyrene, α-2,2-dimethylbutylstyrene, α-2,3-dimethylbutylstyrene, α-2,4-dimethylbutylstyrene, α-3,3-dimethylbutylstyrene, α-3,4-dimethylbutylstyrene, α-4,4-dimethylbutylstyrene, α-2-ethylbutylstyrene, α-1-ethylbutylstyrene, α-cyclohexylstyrene, and α-cyclohexylstyrene. These may be used singly or in combination of two or more kinds thereof.

Examples of monofunctional aromatic compounds in which one carbon-carbon unsaturated double bond is bonded to an aromatic ring and an alkyl group is further bonded to the aromatic ring include a nuclear alkyl-substituted aromatic compound and alkoxy-substituted styrene.

Examples of the nuclear alkyl-substituted aromatic compound include an ethyl vinyl aromatic compound in which an alkyl group bonded to an aromatic ring is an ethyl group, nuclear alkyl-substituted styrene in which an alkyl group is bonded to styrene as an aromatic ring, and nuclear alkyl-substituted aromatic compounds (other nuclear alkyl-substituted aromatic compounds) other than the ethyl vinyl aromatic compound and the nuclear alkyl-substituted styrene.

Examples of the ethyl vinyl aromatic compound include o-ethyl vinyl benzene, m-ethylvinylbenzene, p-ethylvinylbenzene, 2-vinyl-2'-ethylbiphenyl, 2-vinyl-3'-ethylbiphenyl, 2-vinyl-4'-ethylbiphenyl, 3-vinyl-2'-ethylbiphenyl, 3-vinyl-3'-ethylbiphenyl, 3-vinyl-4'-ethylbiphenyl, 4-vinyl-2'-ethylbiphenyl, 4-vinyl-3'-ethylbiphenyl, 4-vinyl-4'-ethylbiphenyl, 1-vinyl-2-ethylnaphthalene, 1-vinyl-3-ethylnaphthalene, 1-vinyl-4-ethylnaphthalene, 1-vinyl-5-ethylnaphthalene, 1-vinyl-6-ethylnaphthalene, 1-vinyl-7-ethylnaphthalene, 1-vinyl-8-ethylnaphthalene, 2-vinyl-1-ethylnaphthalene, 2-vinyl-3-ethylnaphthalene, 2-vinyl-4-ethylnaphthalene, 2-vinyl-5-ethylnaphthalene, 2-vinyl-6-ethylnaphthalene, 2-vinyl-7-ethylnaphthalene, and 2-vinyl-8-ethylnaphthalene.

Examples of the nuclear alkyl-substituted styrene include m-methylstyrene, p-methylstyrene, m-propylstyrene, p-propylstyrene, m-n-butylstyrene, p-n-butylstyrene, m-t-butylstyrene, p-t-butylstyrene, m-n-hexylstyrene, p-n-hexylstyrene, m-cyclohexylstyrene, and p-cyclohexylstyrene.

Examples of the other nuclear alkyl-substituted aromatic compounds include 2-vinyl-2'-propylbiphenyl, 2-vinyl-3'-propylbiphenyl, 2-vinyl-4'-propylbiphenyl, 3-vinyl-2'-propylbiphenyl, 3-vinyl-3'-propylbiphenyl, 3-vinyl-4'-propylbiphenyl, 4-vinyl-2'-propylbiphenyl, 4-vinyl-3'-propylbiphenyl, 4-vinyl-4'-propylbiphenyl, 1-vinyl-2-propylnaphthalene, 1-vinyl-3-propylnaphthalene, 1-vinyl-4-propylnaphthalene, 1-vinyl-5-propylnaphthalene, 1-vinyl-6-propylnaphthalene, 1-vinyl-7-propylnaphthalene, 1-vinyl-8-propylnaphthalene, 2-vinyl-1-propylnaphthalene, 2-vinyl-3-propylnaphthalene, 2-vinyl-4-propylnaphthalene, 2-vinyl-5-propylnaphthalene, 2-vinyl-6-propylnaphthalene, 2-vinyl-7-propylnaphthalene, and 2-vinyl-8-propylnaphthalene.

Examples of the alkoxy-substituted styrene include o-ethoxystyrene, m-ethoxystyrene, p-ethoxystyrene, o-propoxystyrene, m-propoxystyrene, p-propoxystyrene, o-n-butoxystyrene, m-n-butoxystyrene, p-n-butoxystyrene, o-isobutoxystyrene, m-isobutoxystyrene, p-isobutoxystyrene, o-t-butoxystyrene, m-t-butoxystyrene, p-t-butoxystyrene, o-n-pentoxystyrene, m-n-pentoxystyrene, p-n-pentoxystyrene, α-methyl-o-butoxystyrene, α-methyl-m-butoxystyrene, α-methyl-p-butoxystyrene, o-t-pentoxystyrene, m-t-pentoxystyrene, p-t-pentoxystyrene, o-n-hexoxystyrene, m-n-hexoxystyrene, p-n-hexoxystyrene, α-methyl-o-pentoxystyrene, α-methyl-m-pentoxystyrene, α-methyl-p-pentoxystyrene, o-cyclohexoxystyrene, m-cyclohexoxystyrene, p-cyclohexoxystyrene, o-phenoxystyrene, m-phenoxystyrene, and p-phenoxystyrene.

As the monofunctional aromatic compound, the compounds exemplified above may be used singly or in combination of two or more thereof. Among the compounds exemplified above, styrene and p-ethylvinylbenzene are preferable as the monofunctional aromatic compound.

Examples of the trifunctional aromatic compound in which three carbon-carbon unsaturated double bonds are bonded to an aromatic ring include 1,2,4-trivinylbenzene, 1,3,5-trivinylbenzene, 1,2,4-triisopropenylbenzene, 1,3,5-triisopropenylbenzene, 1,3,5-trivinylnaphthalene, and 3,5,4'-trivinylbiphenyl. As the trifunctional aromatic compound, the compounds exemplified above may be used singly or in combination of two or more thereof.

Examples of the indenes include indene, alkyl-substituted indene, and alkoxyindene. Examples of the alkyl-substituted indene include methylindene, ethylindene, propylindene, butylindene, t-butylindene, sec-butylindene, n-pentylindene, 2-methyl-butylindene, 3-methyl-butylindene, n-hexylindene, 2-methyl-pentylindene, 3-methyl-pentylindene, and 4-methyl-pentylindene. Examples of the alkoxyindene include alkoxyindenes such as methoxyindene, ethoxyindene, propoxyindene, butoxyindene, t-butoxyindene, sec-butoxyindene, n-pentoxyindene, 2-methyl-butoxyindene, 3-methyl-butoxyindene, n-hexoxyindene, 2-methyl-pentoxyindene, 3-methyl-pentoxyindene, and 4-methyl-pentoxyindene. As the indenes, the compounds exemplified above may be used singly or in combination of two or more thereof.

Examples of the acenaphthylenes include acenaphthylene, alkylacenaphthylenes, halogenated acenaphthylenes, and phenylacenaphthylenes. Examples of the alkyl acenaphthylenes include 1-methyl acenaphthylene, 3-methyl acenaphthylene, 4-methyl acenaphthylene, 5-methyl acenaphthylene, 1-ethyl acenaphthylene, 3-ethyl acenaphthylene, 4-ethyl acenaphthylene, and 5-ethyl acenaphthylene. Examples of the halogenated acenaphthylenes include 1-chloroacenaphthylene, 3-chloroacenaphthylene, 4-chloroacenaphthylene, 5-chloroacenaphthylene, 1-bromoacenaphthylene, 3-bromoacenaphthylene, 4-bromoacenaphthylene, and 5-bromoacenaphthylene. Examples of the phenylacenaphthylenes include 1-phenylacenaphthylene, 3-phenylacenaphthylene, 4-phenylacenaphthylene, and 5-phenylacenaphthylene. As the acenaphthylenes, the compounds exemplified above may be used singly or in combination of two or more thereof.

When the aromatic polymer has not only a structural unit derived from the bifunctional aromatic compound but also another structural unit, the aromatic polymer is a copolymer of a structural unit derived from the bifunctional aromatic compound and another structural unit such as a structural unit derived from the monofunctional aromatic compound. This copolymer may be a block copolymer or a random copolymer.

The polymer is not particularly limited as long as it is a polymer having the structural unit represented by Formula (1) in the molecule as described above. It is preferable that the structural unit represented by Formula (1) includes a structural unit represented by the following Formula (2).

In other words, the polymer is preferably a polymer having a structural unit represented by the following Formula (2) in the molecule.

[Chem. 3]

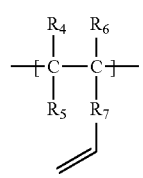

(2)

$R_4$ to $R_6$ in Formula (2) are similar to $R_4$ to $R_6$ in Formula (1). Specifically, $R_4$ to $R_6$ each independently represent a hydrogen atom or an alkyl group having 1 to 6 carbon atoms. $R_7$ represents an arylene group having 6 to 12 carbon atoms.

The arylene group having 6 to 12 carbon atoms in Formula (2) is not particularly limited. Examples of this arylene group include a monocyclic aromatic group such as a phenylene group and a bicyclic aromatic group in which the aromatic is not a monocyclic ring but a bicyclic aromatic such as a naphthalene ring. This arylene group also includes a derivative in which a hydrogen atom bonded to an aromatic ring is substituted with a functional group such as an alkenyl group, an alkynyl group, a formyl group, an alkylcarbonyl group, an alkenylcarbonyl group, or an alkynylcarbonyl group.

It is preferable that the structural unit represented by Formula (2) includes a structural unit represented by the following Formula (3). In other words, in the structural unit represented by Formula (2), $R_7$ is preferably a phenylene group. The phenylene group may be any one or two or more of an o-phenylene group, an m-phenylene group, or a p-phenylene group. As the phenylene group, it is preferable to contain a p-phenylene group.

[Chem. 4]

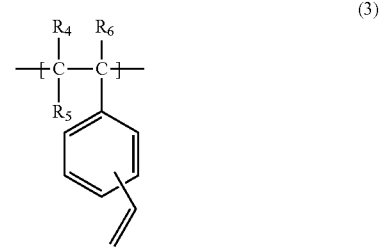

(3)

$R_4$ to $R_6$ in Formula (3) are similar to $R_4$ to $R_6$ in Formula (1). Specifically, $R_4$ to $R_6$ each independently represent a hydrogen atom or an alkyl group having 1 to 6 carbon atoms.

The polymer preferably includes a polymer further having a structural unit represented by the following Formula (4) in the molecule. In other words, it is preferable that the polymer has a structural unit derived from a monofunctional aromatic compound in which one carbon-carbon unsaturated double bond is bonded to an aromatic ring as the structural unit represented by the following Formula (4). Hence, the polymer is preferably a polymer having a structural unit represented by Formula (1) and a structural unit represented by the following Formula (4) in the molecule. In other words, the polymer may have a structural unit other than the structural unit represented by Formula (1) and the structural unit represented by the following Formula (4) (structural unit other than (1) and (4)) as long as it is a polymer having a structural unit represented by Formula (1) and the structural unit represented by the following Formula (4) in the molecule. The polymer may have a structural unit other than (1) and (4), the polymer may be a polymer in which a repeating unit in which the structural unit represented by Formula (1) is repeatedly bonded, a repeating unit in which the structural unit represented by the following Formula (4) is repeatedly bonded, and a repeating unit in which a structural unit other than (1) and (4) is repeatedly bonded are randomly bonded, or the polymer may be a block copolymer or a random copolymer.

[Chem. 5]

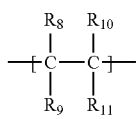
(4)

In Formula (4), $R_8$ to $R_{10}$ are independent of each other. In other words, $R_8$ to $R_{10}$ may be the same group as or different groups from each other. $R_8$ to $R_{10}$ represent a hydrogen atom or an alkyl group having 1 to 6 carbon atoms. $R_{11}$ represents an aryl group.

The alkyl group having 1 to 6 carbon atoms, which is represented by $R_8$ to $R_{10}$ in Formula (4), is not particularly limited and may be similar to the alkyl group having 1 to 6 carbon atoms, which is represented by $R_4$ to $R_6$ in Formula (1). Specific examples of the alkyl group having 1 to 6 carbon atoms, which is represented by $R_8$ to $R_{10}$ in Formula (4), include a methyl group, an ethyl group, a propyl group, and a hexyl group.

The aryl group represented by $R_{11}$ in Formula (4) is not particularly limited, and may be an unsubstituted aryl group or an aryl group in which a hydrogen atom bonded to an aromatic ring is substituted with an alkyl group or the like. The unsubstituted aryl group may be a group obtained by eliminating one hydrogen atom from an aromatic hydrocarbon having one aromatic ring or a group obtained by eliminating one hydrogen atom from an aromatic hydrocarbon having two or more independent aromatic rings (for example, biphenyl). Examples of the aryl group in Formula (4) include an unsubstituted aryl group having 6 to 12 carbon atoms and an arylene group having 6 to 18 carbon atoms in which a hydrogen atom of an aryl group having 6 to 12 carbon atoms is substituted with an alkyl group having 1 to 6 carbon atoms. Examples of the unsubstituted aryl group having 6 to 12 carbon atoms include a phenyl group, a naphthyl group, and a biphenylyl group. Specific examples of the aryl group in Formula (4), namely, $R_{11}$ include the aryl groups presented in the following Tables 1 and 2.

TABLE 1

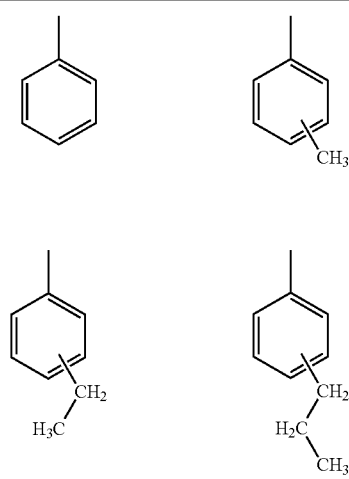

TABLE 1-continued

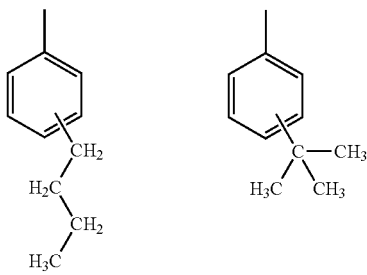

TABLE 2

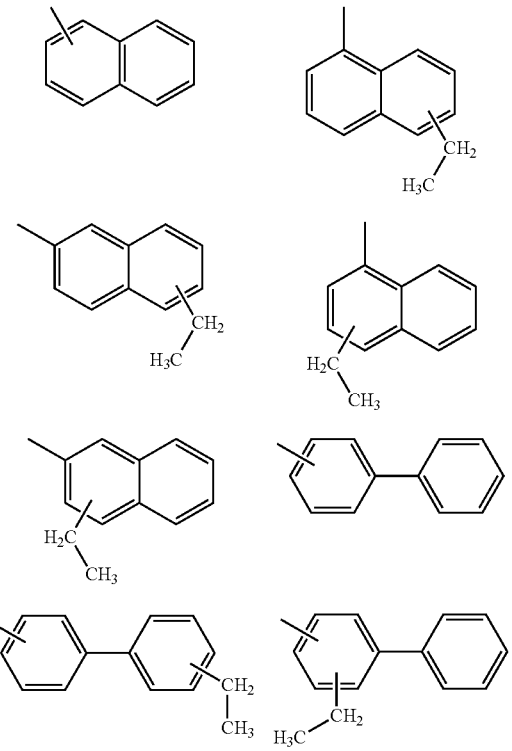

A weight average molecular weight of the polymer is preferably 1,500 to 40,000, more preferably 1,500 to 35,000. When the weight average molecular weight is too low, the heat resistance and the like tend to decrease. When the weight average molecular weight is too high, the moldability and the like tend to decrease. Hence, when the weight average molecular weight of the resin composition is within the above range, excellent heat resistance and moldability are exhibited. Here, the weight average molecular weight is only required to be one measured by general molecular weight measurement, and specific examples thereof include a value measured by gel permeation chromatography (GPC).

In the polymer, when the sum of structural units in the polymer is 100 mol %, the molar content of the structural unit represented by Formula (1) is preferably a molar content within the range of the weight average molecular weight. Specifically, the molar content is preferably 2 to 95 mol %, more preferably 8 to 81 mol %. The molar content of the structural unit represented by Formula (2) and the molar content of the structural unit represented by Formula (3) are similar to the molar content of the structural unit represented by Formula (1). Specifically, the molar contents are preferably 2 to 95 mol %, more preferably 8 to 81 mol %. When the polymer is a polymer having a structural unit represented by Formula (1) and a structural unit represented by Formula (4) in the molecule, the molar content of the structural unit represented by Formula (1) is preferably 2 to 95 mol %, more preferably 8 to 81 mol % and the molar content of the structural unit represented by Formula (4) is preferably 5 to 98 mol %, more preferably 19 to 92 mol %.

In the polymer, the average number of structural units represented by Formula (1) is preferably a number within the range of the weight average molecular weight. Specifically, the average number is preferably 1 to 160, more preferably 3 to 140. The average number of structural units represented by Formula (2) and the average number of structural units represented by Formula (3) are similar to the average number of structural units represented by Formula (1). Specifically, the average number is preferably 1 to 160, more preferably 3 to 140. When the polymer is a polymer having a structural unit represented by Formula (1) and a structural unit represented by Formula (4) in the molecule, the average number of structural units represented by Formula (1) is preferably 1 to 160, more preferably 3 to 140 and the average number of structural units represented by Formula (4) is preferably 2 to 350, more preferably 4 to 300.

Specific examples of the polymer include a polymer having a structural unit represented by the following Formula (6) in the molecule and further at least one of a structural unit represented by the following Formula (5) and a structural unit represented by the following Formula (7). This polymer may be a block copolymer or a random copolymer.

[Chem. 6]

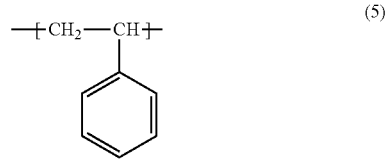

(5)

[Chem. 7]

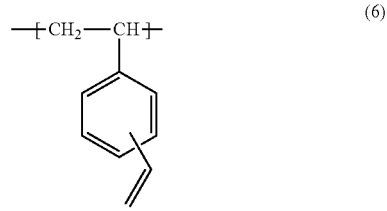

(6)

[Chem. 8]

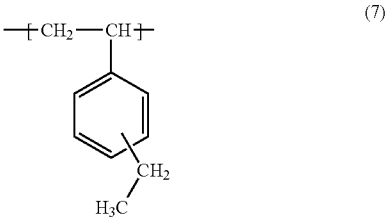

(7)

In the polymer having the structural unit represented by Formula (6) in the molecule and further at least one of the structural unit represented by Formula (5) and the structural unit represented by Formula (7), the molar contents of the structural unit represented by Formula (5), the structural unit represented by Formula (6), and the structural unit represented by Formula (7) are preferably 0 to 92 mol %, 8 to 54 mol %, and 0 to 89 mol %, respectively. The average number of structural units represented by Formula (5) is preferably 0 to 350, the average number of structural units represented by Formula (6) is preferably 1 to 160, and the average number of structural units represented by Formula (7) is preferably 0 to 270.

The equivalent of the vinyl group included in the structural unit represented by Formula (1), where $R_1$ to $R_3$ are a hydrogen atom, of the polymer is preferably 250 to 1200, more preferably 300 to 1100. When the equivalent is too small, the number of the vinyl groups is too large, the reactivity is too high, and for example, troubles such as the decrease in storage stability of the resin composition or the decrease in fluidity of the resin composition may occur. When a resin composition in which the equivalent is too small is used, for example, molding defects such as generation of voids at the time of multilayer molding may occur by insufficient fluidity and the like and a problem with moldability that a highly reliable wiring board is hardly obtained may occur. When the equivalent is too large, the number of the vinyl groups is too small and the heat resistance of the cured product tends to be insufficient. Hence, when the equivalent is within the above range, excellent heat resistance and moldability are exhibited. The equivalent of the vinyl group included in the structural unit represented by Formula (1), where $R_1$ to $R_3$ are a hydrogen atom, is a so-called vinyl equivalent.

The method for producing the polymer is not particularly limited as long as the polymer can be produced. For example, when the polymer is a polymer having the structural units represented by Formulas (5) to (7) in the molecule, examples of the method for producing the polymer include a method in which divinylbenzene, ethylvinylbenzene, and styrene are reacted with one another. Examples of the solvent in this reaction include n-propyl acetate. A catalyst may be used for this reaction, and examples of the catalyst include boron trifluoride-diethyl ether complex.

(Curing Agent)

The curing agent is not particularly limited as long as it is a curing agent capable of reacting with the polymer and curing the resin composition containing the polymer. Examples of the curing agent include a curing agent having at least one or more functional groups contributing to the reaction with the polymer in the molecule. Examples of the curing agent include styrene, styrene derivatives, a compound having an acryloyl group in the molecule, a compound having a methacryloyl group in the molecule, a compound having a vinyl group in the molecule, a compound having an allyl group in the molecule, a compound having a maleimide group in the molecule, a compound having an acenaphthylene structure in the molecule, and an isocyanurate compound having an isocyanurate group in the molecule.

Examples of the styrene derivatives include bromostyrene and dibromostyrene.

The compound having an acryloyl group in the molecule is an acrylate compound. Examples of the acrylate compound include a monofunctional acrylate compound having one acryloyl group in the molecule and a polyfunctional acrylate compound having two or more acryloyl groups in the molecule. Examples of the monofunctional acrylate compound include methyl acrylate, ethyl acrylate, propyl acrylate, and butyl acrylate. Examples of the polyfunctional acrylate compound include tricyclodecanedimethanol diacrylate.

The compound having a methacryloyl group in the molecule is a methacrylate compound. Examples of the methacrylate compound include a monofunctional methacrylate compound having one methacryloyl group in the molecule and a polyfunctional methacrylate compound having two or more methacryloyl groups in the molecule. Examples of the monofunctional methacrylate compound include methyl methacrylate, ethyl methacrylate, propyl methacrylate, and butyl methacrylate. Examples of the polyfunctional methacrylate compound include tricyclodecanedimethanol dimethacrylate.

The compound having a vinyl group in the molecule is a vinyl compound. Examples of the vinyl compound include a monofunctional vinyl compound (monovinyl compound) having one vinyl group in the molecule and a polyfunctional vinyl compound having two or more vinyl groups in the molecule. Examples of the polyfunctional vinyl compound include divinylbenzene and polybutadiene.

The compound having an allyl group in the molecule is an allyl compound. Examples of the allyl compound include a monofunctional allyl compound having one allyl group in the molecule and a polyfunctional allyl compound having two or more allyl groups in the molecule. Examples of the polyfunctional allyl compound include diallyl phthalate (DAP).

The compound having a maleimide group in the molecule is a maleimide compound. Examples of the maleimide compound include a monofunctional maleimide compound having one maleimide group in the molecule, a polyfunctional maleimide compound having two or more maleimide groups in the molecule, and a modified maleimide compound. Examples of the modified maleimide compound include a modified maleimide compound in which a part of the molecule is modified with an amine compound, a modified maleimide compound in which a part of the molecule is modified with a silicone compound, and a modified maleimide compound in which a part of the molecule is modified with an amine compound and a silicone compound.

The compound having an acenaphthylene structure in the molecule is an acenaphthylene compound. Examples of the acenaphthylene compound include acenaphthylene, alkylacenaphthylenes, halogenated acenaphthylenes, and phenylacenaphthylenes. Examples of the alkyl acenaphthylenes include 1-methyl acenaphthylene, 3-methyl acenaphthylene, 4-methyl acenaphthylene, 5-methyl acenaphthylene, 1-ethyl acenaphthylene, 3-ethyl acenaphthylene, 4-ethyl acenaphthylene, and 5-ethyl acenaphthylene. Examples of the halogenated acenaphthylenes include 1-chloroacenaphthylene, 3-chloroacenaphthylene, 4-chloroacenaphthylene, 5-chloroacenaphthylene, 1-bromoacenaphthylene, 3-bromoacenaphthylene, 4-bromoacenaphthylene, and 5-bromoacenaphthylene. Examples of the phenylacenaphthylenes include 1-phenylacenaphthylene, 3-phenylacenaphthylene, 4-phenylacenaphthylene, and 5-phenylacenaphthylene. The acenaphthylene compound may be a monofunctional acenaphthylene compound having one acenaphthylene structure in the molecule as described above or may be a polyfunctional acenaphthylene compound having two or more acenaphthylene structures in the molecule.

The compound having an isocyanurate group in the molecule is an isocyanurate compound. Examples of the isocyanurate compound include a compound having an alkenyl group in the molecule (alkenyl isocyanurate compound), and examples thereof include a trialkenyl isocyanurate compound such as triallyl isocyanurate (TAIC).

Among the above, the curing agent is preferably, for example, a polyfunctional acrylate compound having two or more acryloyl groups in the molecule, a polyfunctional methacrylate compound having two or more methacryloyl groups in the molecule, a polyfunctional vinyl compound having two or more vinyl groups in the molecule, a styrene derivative, an allyl compound having an allyl group in the molecule, a maleimide compound having a maleimide group in the molecule, an acenaphthylene compound having an acenaphthylene structure in the molecule, and an isocyanurate compound having an isocyanurate group in the molecule.

As the curing agent, the above curing agents may be used singly or in combination of two or more thereof.

The weight average molecular weight of the curing agent is preferably 100 to 5000, more preferably 100 to 4000, still more preferably 100 to 3000. When the weight average molecular weight of the curing agent is too low, the curing agent may easily volatilize from the compounding component system of the resin composition. When the weight average molecular weight of the curing agent is too high, the viscosity of the varnish of the resin composition and the melt viscosity at the time of heat molding may be too high. Hence, a resin composition imparting superior heat resistance to the cured product is obtained when the weight average molecular weight of the curing agent is within such a range. It is considered that this is because the resin composition containing the polymer can be suitably cured by the reaction of the curing agent with the polymer. Here, the weight average molecular weight may be measured by a general molecular weight measurement method, and specific examples thereof include a value measured by gel permeation chromatography (GPC).

The average number (number of functional groups) of the functional groups which contribute to the reaction of the curing agent with the polymer per one molecule of the curing agent varies depending on the weight average molecular weight of the curing agent but is, for example, preferably 1 to 20, more preferably 2 to 18. When this number of functional groups is too small, sufficient heat resistance of the cured product tends to be hardly attained. When the number of functional groups is too large, the reactivity is too high and, for example, troubles such as a decrease in the storage stability of the resin composition or a decrease in the fluidity of the resin composition may occur.

(Modified Polyphenylene Ether Compound)

It is preferable that the resin composition further contains a modified polyphenylene ether compound of which the terminal is modified with a substituent having a carbon-carbon unsaturated double bond. The modified polyphenylene ether compound is not particularly limited as long as it is a modified polyphenylene ether compound of which the terminal is modified with a substituent having a carbon-carbon unsaturated double bond.

The substituent having a carbon-carbon unsaturated double bond is not particularly limited. Examples of the substituent include a substituent represented by the following Formula (8) and a substituent represented by the following Formula (9).

[Chem. 9]

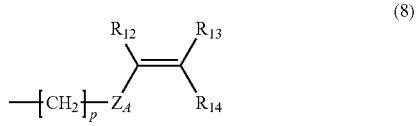

(8)

In Formula (8), p represents an integer 0 to 10. $Z_A$ represents an arylene group. $R_{12}$ to $R_{14}$ are independent of each other. In other words, $R_{12}$ to $R_{14}$ may be the same group as or different groups from each other. $R_{12}$ to $R_{14}$ represent a hydrogen atom or an alkyl group.

In a case where p in Formula (8) is 0, it indicates that $Z_A$ is directly bonded to the terminal of polyphenylene ether.

This arylene group is not particularly limited. Examples of this arylene group include a monocyclic aromatic group such as a phenylene group, and a polycyclic aromatic group in which the aromatic is not a single ring but a polycyclic aromatic such as a naphthalene ring. This arylene group also includes a derivative in which a hydrogen atom bonded to an aromatic ring is substituted with a functional group such as an alkenyl group, an alkynyl group, a formyl group, an alkylcarbonyl group, an alkenylcarbonyl group, or an alkynylcarbonyl group. The alkyl group is not particularly limited and is, for example, preferably an alkyl group having 1 to 18 carbon atoms, more preferably an alkyl group having 1 to 10 carbon atoms. Specific examples thereof include a methyl group, an ethyl group, a propyl group, a hexyl group, and a decyl group.

[Chem. 10]

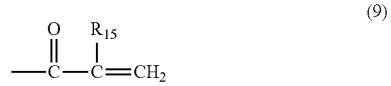

(9)

In Formula (9), $R_{15}$ represents a hydrogen atom or an alkyl group. The alkyl group is not particularly limited and is, for example, preferably an alkyl group having 1 to 18 carbon atoms, more preferably an alkyl group having 1 to 10 carbon atoms. Specific examples thereof include a methyl group, an ethyl group, a propyl group, a hexyl group, and a decyl group.

Preferred specific examples of the substituent represented by Formula (8) include, for example, a substituent having a vinylbenzyl group. Examples of the substituent having a vinylbenzyl group include a substituent represented by the following Formula (10). Examples of the substituent represented b Formula 9 include an acrylate group and a methacrylate group.

[Chem. 11]

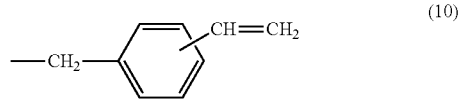

(10)

More specific examples of the substituent include a vinylbenzyl group (ethenylbenzyl group), a vinylphenyl group, an acrylate group, and a methacrylate group. The vinylbenzyl group may be any one or two or more of an o-ethenylbenzyl group, an m-ethenylbenzyl group, or a p-ethenylbenzyl group.

It is preferable that the modified polyphenylene ether compound has a polyphenylene ether chain in the molecule and has, for example, a repeating unit represented by the following Formula (11) in the molecule.

[Chem. 12]

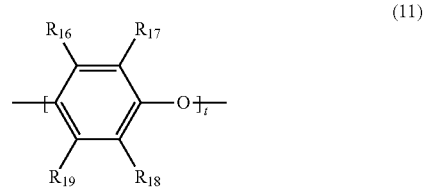

(11)

In Formula (11), t represents 1 to 50. $R_{16}$ to $R_{19}$ are independent of each other. In other words, $R_{16}$ to $R_{19}$ may be the same group as or different groups from each other. $R_{16}$ to $R_{19}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

Specific examples of the respective functional groups mentioned in $R_{16}$ to $R_{19}$ include the following.

The alkyl group is not particularly limited and is, for example, preferably an alkyl group having 1 to 18 carbon atoms, more preferably an alkyl group having 1 to 10 carbon atoms. Specific examples thereof include a methyl group, an ethyl group, a propyl group, a hexyl group, and a decyl group.

The alkenyl group is not particularly limited and is, for example, preferably an alkenyl group having 2 to 18 carbon atoms, more preferably an alkenyl group having 2 to 10 carbon atoms. Specific examples thereof include a vinyl group, an allyl group, and a 3-butenyl group.

The alkynyl group is not particularly limited and is, for example, preferably an alkynyl group having 2 to 18 carbon atoms, more preferably an alkynyl group having 2 to 10 carbon atoms. Specific examples thereof include an ethynyl group and a prop-2-yn-1-yl group (propargyl group).

The alkylcarbonyl group is not particularly limited as long as it is a carbonyl group substituted with an alkyl group and is, for example, preferably an alkylcarbonyl group having 2 to 18 carbon atoms, more preferably an alkylcarbonyl group having 2 to 10 carbon atoms. Specific examples thereof include an acetyl group, a propionyl group, a butyryl group, an isobutyryl group, a pivaloyl group, a hexanoyl group, an octanoyl group, and a cyclohexylcarbonyl group.

The alkenylcarbonyl group is not particularly limited as long as it is a carbonyl group substituted with an alkenyl group and is, for example, preferably an alkenylcarbonyl group having 3 to 18 carbon atoms, more preferably an alkenylcarbonyl group having 3 to 10 carbon atoms. Specific examples thereof include an acryloyl group, a methacryloyl group, and a crotonoyl group.

The alkynylcarbonyl group is not particularly limited as long as it is a carbonyl group substituted with an alkynyl group and is, for example, preferably an alkynylcarbonyl group having 3 to 18 carbon atoms, more preferably an alkynylcarbonyl group having 3 to 10 carbon atoms. Specific examples thereof include a propioloyl group.

The weight average molecular weight (Mw) of the modified polyphenylene ether compound is not particularly limited. Specifically, the weight average molecular weight is preferably 500 to 5000, more preferably 800 to 4000, and still more preferably 1000 to 3000. Here, the weight average molecular weight may be measured by a general molecular weight measurement method, and specific examples thereof include a value measured by gel permeation chromatography (GPC). In a case where the modified polyphenylene ether compound has a repeating unit represented by Formula (11) in the molecule, t is preferably a numerical value so that the weight average molecular weight of the modified polyphenylene ether compound is within such a range. Specifically, t is preferably 1 to 50.

When the weight average molecular weight of the modified polyphenylene ether compound is within such a range, the modified polyphenylene ether compound exhibits the excellent low dielectric properties of polyphenylene ether and not only imparts superior heat resistance to the cured product but also exhibits excellent moldability. This is considered to be due to the following. When the weight average molecular weight of ordinary polyphenylene ether is within such a range, the heat resistance of the cured product tends to decrease since the molecular weight is relatively low. With regard to this point, since the modified polyphenylene ether compound according to the present embodiment has one or more unsaturated double bonds at the terminal, it is considered that a cured product exhibiting sufficiently high heat resistance is obtained. When the weight average molecular weight of the modified polyphenylene ether compound is within such a range, the modified polyphenylene ether compound has a relatively low molecular weight and is thus considered to be also excellent in moldability. Hence, it is considered that such a modified polyphenylene ether compound not only imparts superior heat resistance to the cured product but also exhibits excellent moldability.

In the modified polyphenylene ether compound, the average number of the substituents (number of terminal functional groups) at the molecule terminal per one molecule of the modified polyphenylene ether compound is not particularly limited. Specifically, the number of terminal functional groups is preferably 1 to 5, more preferably 1 to 3, still more preferably 1.5 to 3. When this number of terminal functional groups is too small, sufficient heat resistance of the cured product tends to be hardly attained. When the number of terminal functional groups is too large, the reactivity is too high and, for example, troubles such as deterioration in the storage stability of the resin composition or deterioration in the fluidity of the resin composition may occur. In other words, when such a modified polyphenylene ether compound is used, for example, molding defects such as generation of voids at the time of multilayer molding occur because of insufficient fluidity and the like and a problem of moldability that a highly reliable printed wiring board is hardly obtained may arise.

The number of terminal functional groups in the modified polyphenylene ether compound includes a numerical value expressing the average value of the substituents per one molecule of all the modified polyphenylene ether compounds existing in 1 mole of the modified polyphenylene ether compound. This number of terminal functional groups can be determined, for example, by measuring the number of hydroxyl groups remaining in the obtained modified polyphenylene ether compound and calculating the number of hydroxyl groups decreased from the number of hydroxyl groups in the polyphenylene ether before being modified. The number of hydroxyl groups decreased from the number of hydroxyl groups in the polyphenylene ether before being modified is the number of terminal functional groups. With regard to the method for measuring the number of hydroxyl groups remaining in the modified polyphenylene ether compound, the number of hydroxyl groups can be determined by adding a quaternary ammonium salt (tetraethylammonium hydroxide) to be associated with a hydroxyl group to a solution of the modified polyphenylene ether compound and measuring the UV absorbance of the mixed solution.

The intrinsic viscosity of the modified polyphenylene ether compound is not particularly limited. Specifically, the intrinsic viscosity may be 0.03 to 0.12 dl/g and is preferably 0.04 to 0.11 dl/g, more preferably 0.06 to 0.095 dl/g. When the intrinsic viscosity is too low, the molecular weight tends to be low and low dielectric properties such as a low dielectric constant and a low dielectric loss tangent tend to be hardly attained. When the intrinsic viscosity is too high, the viscosity is high, sufficient fluidity is not attained, and the moldability of the cured product tends to decrease. Hence, if the intrinsic viscosity of the modified polyphenylene ether compound is in the above range, excellent heat resistance and moldability of the cured product can be realized.

The intrinsic viscosity here is an intrinsic viscosity measured in methylene chloride at 25° C. and more specifically is, for example, a value acquired by measuring the intrinsic viscosity of a methylene chloride solution (liquid temperature: 25° C.) at 0.18 g/45 ml using a viscometer. Examples of the viscometer include AVS500 Visco System manufactured by SCHOTT Instruments GmbH.

Examples of the modified polyphenylene ether compound include a modified polyphenylene ether compound represented by the following Formula (12) and a modified polyphenylene ether compound represented by the following Formula (13). Moreover, as the modified polyphenylene ether compound, these modified polyphenylene ether compounds may be used singly or two kinds of these modified polyphenylene ether compounds may be used in combination.

[Chem. 13]

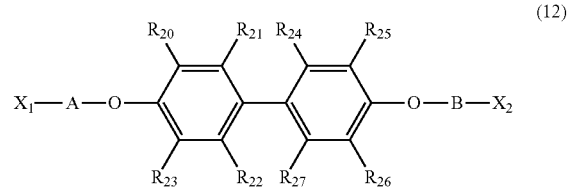

(12)

[Chem. 14]

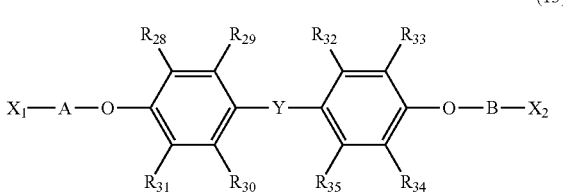

(13)

In Formulas (12) and (13), $R_{20}$ to $R_{27}$ and $R_{28}$ to $R_{35}$ each independently represent a hydrogen atom, an alkyl group, an alkenyl group, an alkynyl group, a formyl group, an alkylcarbonyl group, an alkenylcarbonyl group, or an alkynylcarbonyl group. $X_1$ and $X_2$ each independently represent a substituent having a carbon-carbon unsaturated double bond. A and B represent a repeating unit represented by the following Formula (14) and a repeating unit represented by the following Formula (15), respectively. In Formula (13), Y represents a linear, branched, or cyclic hydrocarbon having 20 or less carbon atoms.

[Chem. 15]

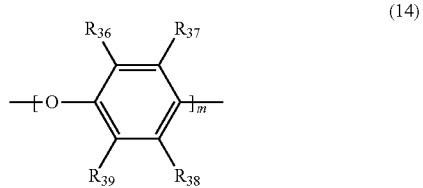
(14)

[Chem. 16]

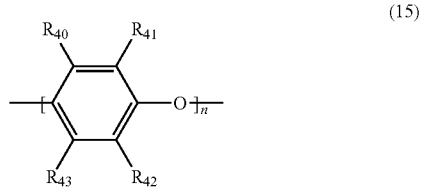
(15)

In Formulas (14) and (15), m and n each represent 0 to 20. $R_{36}$ to $R_{39}$ and $R_{40}$ to $R_{43}$ each independently represent a hydrogen atom, an alkyl group, an alkenyl group, an alkynyl group, a formyl group, an alkylcarbonyl group, an alkenylcarbonyl group, or an alkynylcarbonyl group.

The modified polyphenylene ether compound represented by Formula (12) and the modified polyphenylene ether compound represented by Formula (13) are not particularly limited as long as they satisfy the above configuration. Specifically, in Formulas (12) and (13), $R_{20}$ to $R_{27}$ and $R_{28}$ to $R_{35}$ are independent of each other as described above. In other words, $R_{20}$ to $R_{27}$ and $R_{28}$ to $R_{35}$ may be the same group as or different groups from each other. $R_{20}$ to $R_{27}$ and $R_{28}$ to $R_{35}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

represents 1 to 30. $R_{36}$ to $R_{39}$ and $R_{40}$ to $R_{43}$ are independent of each other. In other words, $R_{36}$ to $R_{39}$ and $R_{40}$ to $R_{43}$ may be the same group as or different groups from each other. $R_{36}$ to $R_{39}$ and $R_{40}$ to $R_{43}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

$R_{20}$ to $R_{43}$ are the same as $R_{16}$ to $R_{19}$ in Formula (11).

In Formula (13), Y represents a linear, branched, or cyclic hydrocarbon having 20 or less carbon atoms as described above. Examples of Y include a group represented by the following Formula (16).

[Chem. 17]

(16)

In Formula (16). $R_{44}$ and $R_{45}$ each independently represent a hydrogen atom or an alkyl group. Examples of the alkyl group include a methyl group. Examples of the group represented by Formula (16) include a methylene group, a methylmethylene group, and a dimethylmethylene group. Among these, a dimethylmethylene group is preferable.

In Formulas (12) and (13), $X_1$ and $X_2$ each independently represent a substituent having a carbon-carbon unsaturated double bond. The substituents $X_1$ and $X_2$ are not particularly limited as long as they are substituents having a carbon-carbon unsaturated double bond. Examples of the substituents $X_1$ and $X_2$ include a substituent represented by Formula (9) and a substituent represented by Formula (10). In the modified polyphenylene ether compound represented by Formula (12) and the modified polyphenylene ether compound represented by Formula (13), $X_1$ and $X_2$ may be the same substituent as or different substituents from each other.

More specific examples of the modified polyphenylene ether compound represented by Formula (12) include a modified polyphenylene ether compound represented by the following Formula (17).

[Chem. 18]

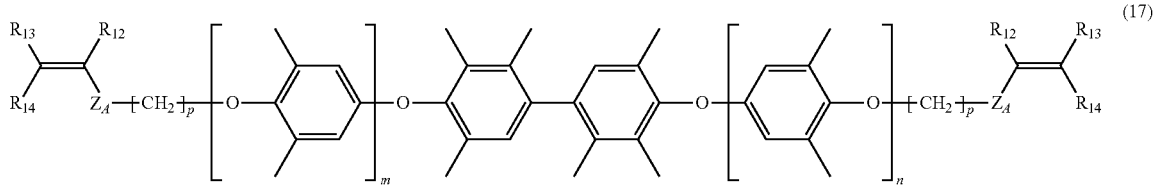
(17)

In Formulas (14) and (15), m and n each preferably represent 0 to 20 as described above. It is preferable that m and n represent numerical values so that the sum of m and n is 1 to 30. Hence, it is more preferable that m represents 0 to 20, n represents 0 to 20, and the sum of m and n More specific examples of the modified polyphenylene ether compound represented by Formula (13) include a modified polyphenylene ether compound represented by the following Formula (18) and a modified polyphenylene ether compound represented by the following Formula (19).

[Chem. 19]

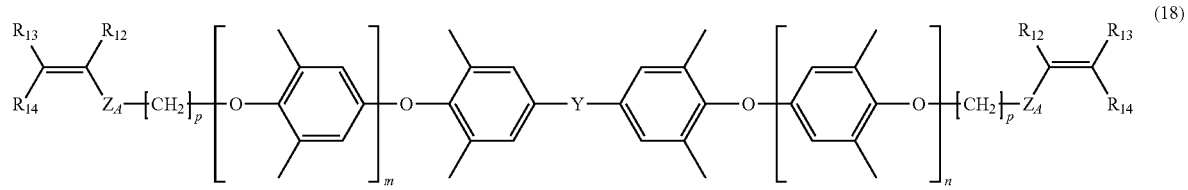

(18)

[Chem. 20]

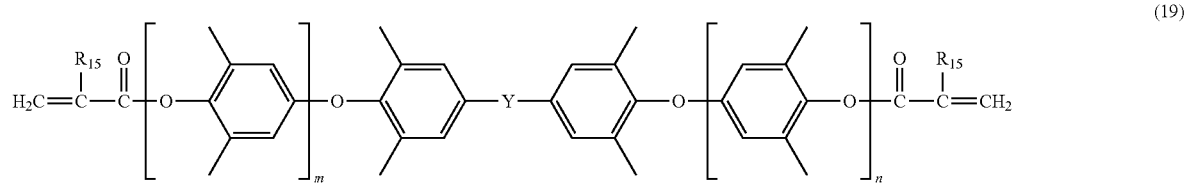

(19)

In Formulas (17) to (19), m and n are the same as m and n in Formulas (14) and (15). In Formulas (17) and (18), $R_{12}$ to $R_{14}$, p, and $Z_A$ are the same as $R_{12}$ to $R_{14}$, p, and $Z_A$ in Formula (8). In Formulas (18) and (19), Y is the same as Y in Formula (13). In Formula (19), $R_{15}$ is the same as $R_{15}$ in Formula (9).

The method for synthesizing the modified polyphenylene ether compound used in the present embodiment is not particularly limited as long as a modified polyphenylene ether compound of which the terminal is modified with a substituent having a carbon-carbon unsaturated double bond can be synthesized. Specific examples thereof include a method in which polyphenylene ether is reacted with a compound in which a substituent having a carbon-carbon unsaturated double bond is bonded to a halogen atom.

Examples of the compound in which a substituent having a carbon-carbon unsaturated double bond is bonded to a halogen atom include compounds in which the substituents represented by Formulas (8) to (10) are bonded to a halogen atom. Specific examples of the halogen atom include a chlorine atom, a bromine atom, an iodine atom, and a fluorine atom. Among these, a chlorine atom is preferable. More specific examples of the compound in which a substituent having a carbon-carbon unsaturated double bond is bonded to a halogen atom include p-chloromethylstyrene and m-chloromethylstyrene.

Polyphenylene ether which is a raw material is not particularly limited as long as a predetermined modified polyphenylene ether compound can be finally synthesized. Specific examples thereof include those containing polyphenylene ether containing 2,6-dimethylphenol and at least one of a bifunctional phenol and a trifunctional phenol and polyphenylene ether such as poly(2,6-dimethyl-1,4-phenylene oxide) as a main component. The bifunctional phenol is a phenol compound having two phenolic hydroxyl groups in the molecule, and examples thereof include tetramethyl bisphenol A. The trifunctional phenol is a phenol compound having three phenolic hydroxyl groups in the molecule.

Examples of the method for synthesizing the modified polyphenylene ether compound include the methods described above. Specifically, polyphenylene ether as described above and a compound in which a substituent having a carbon-carbon unsaturated double bond is bonded to a halogen atom are dissolved in a solvent and stirred. By doing so, polyphenylene ether reacts with the compound in which a substituent having a carbon-carbon unsaturated double bond is bonded to a halogen atom, and the modified polyphenylene ether compound to be used in the present embodiment is obtained.

The reaction is preferably conducted in the presence of an alkali metal hydroxide. By doing so, it is considered that this reaction suitably proceeds. This is considered to be because the alkali metal hydroxide functions as a dehydrohalogenating agent, specifically, a dehydrochlorinating agent. In other words, it is considered that the alkali metal hydroxide eliminates the hydrogen halide from the phenol group in polyphenylene ether and the compound in which a substituent having a carbon-carbon unsaturated double bond is bonded to a halogen atom, and by doing so, the substituent having a carbon-carbon unsaturated double bond is bonded to the oxygen atom of the phenol group instead of the hydrogen atom of the phenol group in the polyphenylene ether.

The alkali metal hydroxide is not particularly limited as long as it can act as a dehalogenating agent, and examples thereof include sodium hydroxide. In addition, the alkali metal hydroxide is usually used in the form of an aqueous solution and is specifically used as an aqueous sodium hydroxide solution.

The reaction conditions such as reaction time and reaction temperature also vary depending on the compound in which a substituent having a carbon-carbon unsaturated double bond is bonded to a halogen atom and the like, and are not particularly limited as long as they are conditions under which the reaction as described above suitably proceeds. Specifically, the reaction temperature is preferably room temperature to 100° C., more preferably 30° C. to 100° C. The reaction time is preferably 0.5 to 20 hours, more preferably 0.5 to 10 hours.

The solvent to be used at the time of the reaction is not particularly limited as long as it can dissolve polyphenylene ether and the compound in which a substituent having a carbon-carbon unsaturated double bond is bonded to a halogen atom, and does not inhibit the reaction of polyphenylene ether with the compound in which a substituent having a carbon-carbon unsaturated double bond is bonded to a halogen atom. Specific examples thereof include toluene.

The above reaction is preferably conducted in the presence of not only an alkali metal hydroxide but also a phase transfer catalyst. In other words, the above reaction is preferably conducted in the presence of an alkali metal hydroxide and a phase transfer catalyst. By doing so, it is considered that the above reaction more suitably proceeds. This is considered to be due to the following. This is considered to be because the phase transfer catalyst is a catalyst which has a function of taking in the alkali metal hydroxide, is soluble in both phases of a phase of a polar solvent such as water and a phase of a non-polar solvent such as an organic solvent, and can transfer between these phases. Specifically, in a case where an aqueous sodium hydroxide solution is used as an alkali metal hydroxide and an organic solvent, such as toluene, which is incompatible with water is used as a solvent, it is considered that even when the aqueous sodium hydroxide solution is dropped into the solvent subjected to the reaction, the solvent and the aqueous sodium hydroxide solution are separated from each other and the sodium hydroxide is hardly transferred to the solvent. In that case, it is considered that the aqueous sodium hydroxide solution added as an alkali metal hydroxide hardly contributes to the promotion of the reaction. In contrast, when the reaction is conducted in the presence of an alkali metal hydroxide and a phase transfer catalyst, it is considered that the alkali metal hydroxide is transferred to the solvent in the state of being taken in the phase transfer catalyst and the aqueous sodium hydroxide solution is likely to contribute to the promotion of the reaction. For this reason, when the reaction is conducted in the presence of an alkali metal hydroxide and a phase transfer catalyst, it is considered that the above reaction more suitably proceeds.

The phase transfer catalyst is not particularly limited, and examples thereof include quaternary ammonium salts such as tetra-n-butylammonium bromide.

The resin composition to be used in the present embodiment preferably contains a modified polyphenylene ether compound obtained as described above as the modified polyphenylene ether compound.

(Inorganic Filler)

As described above, the inorganic filler contains silica in which the ratio of the number of Si atoms contained in the silanol groups to the total number of Si atoms is 3% or less. The content of the silica is preferably 50% to 100% by mass, more preferably 70% to 100% by mass with respect to the total amount of the inorganic filler. The inorganic filler may contain an inorganic filler other than the silica, but preferably contains only the silica. In other words, the content of the silica is preferably 100% by mass with respect to the total amount of the inorganic filler.

In the silica, the ratio of the number of Si atoms contained in the silanol groups to the total number of Si atoms is 3% or less, preferably 2.5% or less, more preferably 2% or less. It is more preferable as this ratio is lower, but in reality, the limit is about 0.1%. From this fact, the ratio is preferably 0.1% to 3%.

The ratio of the number of Si atoms contained in the silanol groups to the total number of Si atoms in silica is not particularly limited as long as the ratio of the number of Si atoms contained in the silanol groups (Si—OH) contained in silica to the total number of Si atoms contained in the silica can be measured. Specifically, the ratio can be measured as follows.

First, silica may have a Q1 structure in which three OH groups are bonded to a Si atom, a Q2 structure in which two OH groups are bonded to a Si atom, a Q3 structure in which one OH group is bonded to a Si atom, and a Q4 structure in which an OH group is not bonded to a Si atom.

Meanwhile, the Q1 structure is a structure represented by the following Formula (20), the Q2 structure is a structure represented by the following Formula (21), the Q3 structure is a structure represented by the following Formula (22), and the Q4 structure is a structure represented by the following Formula (23).

[Chem. 21]

(20)

[Chem. 22]

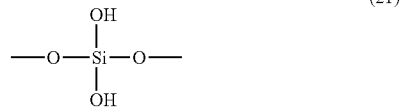

(21)

[Chem. 23]

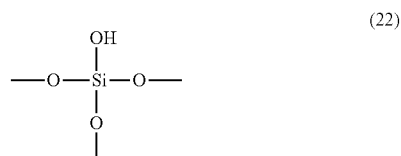

(22)

[Chem. 24]

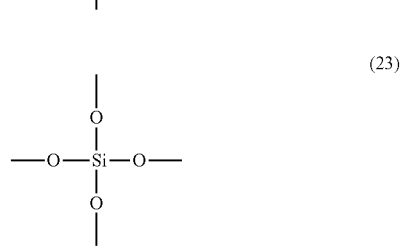

(23)

Among the structures, the structures having a silanol group are the Q1 structure, the Q2 structure, and the Q3 structure. The number of Si atoms contained in the silanol groups determined by measurement means the number of Si atoms to which at least one OH group is bonded, namely, the total number of the Q1 structures, the Q2 structures, and the Q3 structures. Meanwhile, the amount of silanol groups may be evaluated by the proportion of Si atoms contained in the silanol groups to the total number of Si atoms or by the proportion of Si atoms contained in the silanol groups to the number of Q4 structures. Since silica actually hardly has the Q1 structure, it can be said that the number of Si atoms contained in the silanol groups is synonymous with the total number of the Q2 structures and the Q3 structures, and the total number of Si atoms is synonymous with the total number of the Q2 structures, the Q3 structures, and the Q4 structures. From these facts, in the present embodiment, the amount of silanol groups is evaluated by the proportion of the total number of the Q2 structures and the Q3 structures to the total number of the Q2 structures, the Q3 structures, and the Q4 structures. In other words, the ratio of the number of Si atoms contained in the silanol groups to the total number of Si atoms is, in the present embodiment, the proportion of the total number of the Q2 structures and the Q3 structures to the number of the total number of the Q2 structures, the Q3 structures, and the Q4 structures.

First, the spectrum of silica is acquired by solid-state $^{29}$Si-NMR measurement by the dipolar decoupling (DD) method as illustrated in FIG. 1. FIG. 1 is a view illustrating an example of the solid-state $^{29}$Si-NMR spectrum 101 of silica. The solid-state $^{29}$Si-NMR spectrum of silica is acquired as a spectrum in which peaks 102, 103, and 104 each attributed to silicon contained in the Q2 structure, the Q3 structure, and the Q4 structure overlap each other. This solid-state $^{29}$Si-NMR spectrum 101 of silica acquired is an example of the solid-state $^{29}$Si-NMR spectrum of silica, and is acquired as a spectrum in which the peaks 102, 103, and 104 (or the peaks 103 and 104) overlap each other although the size of each peak differs according to silica.

Next, since the acquired spectrum 101 is acquired as a spectrum in which the peaks 102, 103, and 104 (or the peaks 103 and 104) overlap each other as described above, waveform separation is performed on this spectrum. By doing so, the peaks 102, 103, and 104 are acquired as illustrated in FIG. 1. In other words, from the attribution of the acquired spectrum, one having a peak top near −90 ppm and a broad peak 102 near −85 to −95 ppm represents the Q2 structure, one having a peak top near −100 ppm and a broad peak 103 near −96 to −105 ppm represents the Q3 structure, and one having a peak top near −110 ppm and a broad peak 104 near −106 to −115 ppm represents the Q4 structure, respectively. As described above, the Q1 structure hardly exist.

Each peak area (integrated area) is then determined from each peak acquired. Each peak area is determined as follows, for example. As the peak area of the Q2 structure, the area (integrated value) of the peak having a peak top near −90 ppm is determined. In other words, as the peak area of the Q2 structure, the area surrounded by the peak 102 (for example, the area surrounded by the peak 102 and the X-axis) is determined. As the peak area of the Q3 structure, the area (integrated value) of the peak having a peak top near −100 ppm is determined. In other words, as the peak area of the Q3 structure, the area surrounded by the peak 103 (for example, the area surrounded by the peak 103 and the X-axis) is determined. As the peak area of the Q4 structure, the area (integrated value) of the peak having a peak top near −110 ppm is determined. In other words, as the peak area of the Q4 structure, the area surrounded by the peak 104 (for example, the area surrounded by the peak 104 and the X-axis) is determined. The peak areas (integrated areas) of the Q2 structure, the Q3 structure, and the Q4 structure are denoted as SQ2, SQ3, and SQ4, respectively, and the proportion (=(SQ2+SQ3)/(SQ2+SQ3+SQ4)×100(%)) of the total number of the Q2 structures and the Q3 structures to the total number of the Q2 structures, the Q3 structures, and the Q4 structures is calculated as the ratio of the number of silanol groups to the number of Si atoms.

From these facts, the silanol group amount (=(SQ2+SQ3)/(SQ2+SQ3+SQ4)×100(%)) in the silica is 3% or less, the silanol group amount being calculated by acquiring the spectrum of the silica by solid-state $^{29}$Si-NMR measurement by the dipolar decoupling (DD) method, performing waveform separation on the acquired spectrum, and denoting the peak areas (integrated areas) of the Q2 structure, the Q3 structure, and the Q4 structure as SQ2, SQ3, and SQ4, respectively. Here, examples of the peak areas of the Q2 structure, the Q3 structure, and the Q4 structure include values determined by determining the area (integrated value) of the peak having a peak top at −90 ppm, the area (integrated value) of the peak having a peak top at −100 ppm, and the area (integrated value) of the peak having a peak top at −110 ppm as described above.

A volume average particle size of the silica is not particularly limited but, for example, is preferably 0.1 to 5 μm, more preferably 0.3 to 1 μm. When the volume average particle size of the silica is within the above range, the resin composition containing the silica provides a cured product which exhibits low dielectric properties and higher heat resistance and can more suitably maintain the low dielectric properties even after a water absorption treatment. The volume average particle size here can be calculated from the particle size distribution measured by a known method such as a dynamic light scattering method. For example, the particle size can be measured using a particle size analyzer (Multisizer 3 manufactured by Beckman Coulter, Inc.) or the like.

The silica is not particularly limited as long as the silanol group amount is 3% or less, and examples thereof include spherical silica and amorphous silica. The silica is preferably, for example, spherical amorphous silica. Examples of the silica include silica produced as follows.

Examples of the silica include silica that has been subjected to a surface treatment to decrease the number of OH groups present on the surface. Examples of the surface treatment include treatments so that the silanol group amount becomes 3% or less, and examples thereof include treatments using a silane coupling agent and an organosilazane. Specific examples of the silica include silica obtained by treating silica with a silane coupling agent (first silane coupling agent) having an organic functional group and an alkoxy group in the molecule and then treating (organosilazane treatment) the silica treated with the first silane coupling agent with an organosilazane. Other specific examples of the silica include silica obtained by treating the silica treated with the first silane coupling agent with a silane coupling agent (second silane coupling agent) having an alkyl group and an alkoxy group in the molecule by replacing an organosilazane with the second silane coupling agent in the organosilazane treatment and then separately treating the silica treated with the first and second silane coupling agents with an organosilazane. In other words, examples of the silica include silica obtained by treating silica with a silane coupling agent (first silane coupling agent) having an organic functional group and an alkoxy group in the molecule, then treating the silica treated with the first silane coupling agent with an organosilazane and a silane coupling agent (second silane coupling agent) having an alkyl group and an alkoxy group in the molecule by replacing a part of the organosilazane with the second silane coupling agent when the organosilazane treatment is performed, and treating the treated silica with an organosilazane. The silica is not limited to the two kinds of silica, but these two kinds of silica are preferable, in particular, silica obtained by using a second silane coupling is more preferable between these two kinds of silica.

The first silane coupling agent is not particularly limited as long as it is a silane coupling agent having an organic functional group and an alkoxy group in the molecule. Examples of the first silane coupling agent include a silane coupling agent having one organic functional group and three alkoxy groups in the molecule. Examples of the organic functional group include reactive groups that chemically bond to an organic material, and examples thereof include a phenyl group, a vinyl group, an epoxy group, a methacryloyl group, an amino group, a ureido group, a mercapto group, an isocyanate group, and an acryloyl group. Examples of the first silane coupling agent include phenyltrimethoxysilane, phenyltriethoxysilane, vinyltrimethoxysilane, vinyltriethoxysilane, 2-(3,4-epoxycyclohexyl)ethyltrimethoxysilane, 2-(3,4-epoxycyclohexyl)ethyltriethoxysilane, 3-glycidoxypropyltrimethoxysilane, 3-glycidoxypropyltriethoxysilane, p-styryltrimethoxysilane, p-styryltriethoxysilane, 3-methacryloxypropyltrimethoxysilane, 3-methacryloxypropyltriethoxysilane, 3-acryloxypropyltrimethoxysilane, 3-acryloxypropyltriethoxysilane, N-phenyl-3-aminopropyltrimethoxysilane, and N-phenyl-3-aminopropyltriethoxysilane. As the first silane coupling agent, the silane coupling agents may be used singly or in combination of two or more thereof.

The organosilazane is not particularly limited, and known organosilazanes can be used. Examples of the organosilazane include organodisilazanes such as tetramethyldisilazane, hexamethyldisilazane, pentamethyldisilazane, 1-vinylpentamethyldisilazane, 1,3-divinyl-1,1,3,3-tetramethyldisilazane, and 1,3-dimethyl-1,1,3,3-tetravinyldisilazane, and organotrisilazanes such as octamethyltrisilazane and 1,5-divinylhexamethyltrisilazane. Among these, an organodisilazan is preferable. As the organosilazane, the organosilazanes may be used singly or in combination of two or more thereof.

The second silane coupling agent is not particularly limited as long as it is a silane coupling agent having an alkyl group and an alkoxy group in the molecule. Examples of the second silane coupling agent include a silane coupling agent having one alkyl group and three alkoxy groups in the molecule. Examples of the second silane coupling agent include methyltrimethoxysilane, methyltriethoxysilane, n-propyltrimethoxysilane, n-propyltriethoxysilane, hexyltrimethoxysilane, and hexyltriethoxysilane. As the second silane coupling agent, the silane coupling agents may be used singly or in combination of two or more thereof.

The silica (untreated silica) to be subjected to a surface treatment is not particularly limited as long as it is silica that has a silanol group amount of 3% or less after the surface treatment. Examples of the method for obtaining silica include a vaporized metal combustion method (VMC method) and a method for forming a silica sol. Silica constituting a silica sol is preferable since the silica has a smaller particle size than silica obtained by the VMC method. The VMC method is a method in which chemical flame is formed in an oxygen-containing atmosphere using a burner, metal silicon powder is introduced into this chemical flame in an amount enough to form particle cloud and burned to obtain spherical oxide particles.

The method for forming a silica sol includes, for example, an alkaline silicate solution preparing step of preparing an alkaline silicate solution by dissolving a silicon-containing substance in an alkaline solution and an aqueous silica sol forming step of forming an aqueous silica sol from the obtained alkaline silicate solution.

Examples of the silicon-containing substance in the alkaline silicate solution preparing step include metal silicon and silicon compounds. Examples of the alkaline solution include a solution in which ammonia is dissolved.

Examples of the aqueous silica sol forming step include a step of forming an aqueous silica sol by adding an acid to the alkaline silicate solution obtained in the alkaline silicate solution preparing step.

As the method for forming a silica sol, one of the alkaline silicate solution preparing step and the aqueous silica sol forming step may include an ammonium salt containing step of containing an ammonium salt in the alkaline silicate solution. When the ammonium salt is contained, the reaction to increase the particle size is likely to proceed thereafter.

When the inorganic filler contains an inorganic filler other than the silica, examples of the inorganic filler other than silica include metal oxides such as alumina, titanium oxide, and mica, metal hydroxides such as aluminum hydroxide and magnesium hydroxide, talc, aluminum borate, barium sulfate, and calcium carbonate.

(Content)

The content of the silica is preferably 10 to 400 parts by mass, more preferably 20 to 300 parts by mass, still more preferably 40 to 200 parts by mass with respect to 100 parts by mass of the components other than the inorganic filler in the resin composition. When the content of the silica is within the above range, a resin composition is obtained which provides a cured product which exhibits low dielectric properties and higher heat resistance and can more suitably maintain the low dielectric properties even after a water absorption treatment.

The content of the polymer is preferably 10 to 95 parts by mass, more preferably 15 to 90 parts by mass, still more preferably 20 to 90 parts by mass with respect to 100 parts by mass of the components other than the inorganic filler in the resin composition. In other words, the content of the polymer is preferably 10 to 95% by mass with respect to the components other than the inorganic filler in the resin composition.

The curing agent may be contained in the resin composition. When the curing agent is contained in the resin composition, for example, the content of the curing agent is preferably 5 to 50 parts by mass, more preferably 10 to 50 parts by mass with respect to 100 parts by mass of the components other than the inorganic filler in the resin composition. The content of the curing agent is preferably 5 to 50 parts by mass, more preferably 10 to 50 parts by mass with respect to 100 parts by mass of the sum of the polymer and the curing agent. When the modified polyphenylene ether compound is also contained in the resin composition, the content of the curing agent is preferably 5 to 50 parts by mass, more preferably 10 to 50 parts by mass with respect to 100 parts by mass of the sum of the polymer, the modified polyphenylene ether compound, and the curing agent.

When the contents of the polymer and the curing agent are each within the above ranges, a resin composition imparting superior heat resistance to the cured product is obtained. It is considered that this is because the curing reaction between the polymer and the curing agent suitably proceeds.

When the modified polyphenylene ether compound is contained in the resin composition, it is preferable that the polymer, the modified polyphenylene ether compound, and the curing agent have the following contents.

The content ratio of the polymer to the modified polyphenylene ether compound is preferably 50:50 to 95:5, more preferably 60:40 to 90:10 in terms of mass ratio. In other words, the content of the polymer is preferably 50 to 95 parts by mass, more preferably 60 to 90 parts by mass with respect to 100 parts by mass of the sum of the polymer and the modified polyphenylene ether compound.

The content of the polymer is preferably 33 to 91 parts by mass, more preferably 40 to 82 parts by mass with respect to 100 parts by mass of the sum of the polymer, the modified polyphenylene ether compound, and the curing agent.

The content of the modified polyphenylene ether compound is preferably 3 to 48 parts by mass, more preferably 6 to 36 parts by mass with respect to 100 parts by mass of the sum of the polymer, the modified polyphenylene ether compound, and the curing agent.

When the contents of the polymer, the modified polyphenylene ether compound, and the curing agent are within the above ranges, a resin composition is obtained which provides a cured product which exhibits lower dielectric properties and higher heat resistance and can more suitably maintain the low dielectric properties even after a water absorption treatment.

(Other Components)

The resin composition according to the present embodiment may contain components (other components) other than the polymer, the modified polyphenylene ether compound, the curing agent, and the inorganic filler if necessary in a range in which the effects of the present invention are not impaired. As the other components contained in the resin composition according to the present embodiment, for example, additives such as a styrene-based elastomer, a silane coupling agent, a flame retardant, an initiator, an antifoaming agent, an antioxidant, a heat stabilizer, an antistatic agent, an ultraviolet absorber, a dye or pigment, a lubricant, and a dispersant may be further contained. In addition to the polymer, the modified polyphenylene ether compound, and the curing agent, the resin composition may contain a thermosetting resin such as polyphenylene ether or an epoxy resin.

As described above, the resin composition according to the present embodiment may contain a styrene-based elastomer.

The styrene-based elastomer is not particularly limited as long as it is a styrene-based elastomer, which can be used as a resin contained in a resin composition or the like used for forming an insulating layer provided on a metal-clad laminate, a wiring board and the like. The resin composition used for forming an insulating layer provided on a metal-clad laminate, a wiring board and the like may be a resin composition used for forming a resin layer provided on a film with resin, a metal foil with resin or the like or a resin composition contained in a prepreg.

The styrene-based elastomer is, for example, a polymer obtained by polymerizing a monomer containing a styrene-based monomer, and may be a styrene-based copolymer. Examples of the styrene-based copolymer include a copolymer obtained by copolymerizing one or more of the styrene-based monomers and one or more of other monomers copolymerizable with the styrene-based monomers. The styrene-based polymer preferably contains a hydrogenated styrene-based copolymer obtained by hydrogenating the styrene-based copolymer.

The styrene-based monomer is not particularly limited, and examples thereof include styrene, styrene derivatives, those in which some of the hydrogen atoms of the benzene ring in styrene are substituted with an alkyl group, those in which some of the hydrogen atoms of the vinyl group in styrene are substituted with an alkyl group, vinyltoluene, α-methylstyrene, butylstyrene, dimethylstyrene, and isopropenyltoluene. As the styrene-based monomer, one of these may be used singly or two or more thereof may be used in combination.

The other copolymerizable monomers are not particularly limited, and examples thereof include olefins such as α-pinene, β-pinene, and dipentene, nonconjugated dienes such as 1,4-hexadiene and 3-methyl-1,4-hexadiene nonconjugated dienes, and conjugated dienes such as 1,3-butadiene and 2-methyl-1,3-butadiene (isoprene). As the other copolymerizable monomers, one of these may be used singly or two or more thereof may be used in combination.

Examples of the styrene-based copolymer include a methylstyrene (ethylene/butylene) methylstyrene copolymer, a methylstyrene (ethylene-ethylene/propylene) methylstyrene copolymer, a styrene isoprene copolymer, a styrene isoprene styrene copolymer, a styrene (ethylene/butylene) styrene copolymer, a styrene (ethylene-ethylene/propylene) styrene copolymer, a styrene butadiene styrene copolymer, a styrene (butadiene/butylene) styrene copolymer, and a styrene isobutylene styrene copolymer.

Examples of the hydrogenated styrene-based copolymer include hydrogenated products of the styrene-based copolymers. More specific examples of the hydrogenated styrene-based copolymer include a hydrogenated methylstyrene (ethylene/butylene) methylstyrene copolymer, a hydrogenated methylstyrene (ethylene-ethylene/propylene) methylstyrene copolymer, a hydrogenated styrene isoprene copolymer, a hydrogenated styrene isoprene styrene copolymer, a hydrogenated styrene (ethylene/butylene) styrene copolymer, and a hydrogenated styrene (ethylene-ethylene/propylene) styrene copolymer.

The styrene-based elastomers may be used singly or in combination of two or more thereof.

The weight average molecular weight of the styrene-based elastomer is preferably 10,000 to 300,000, more preferably 50,000 to 250,000. When the molecular weight is too low, the glass transition temperature of the cured product of the resin composition tends to decrease or the heat resistance thereof tends to decrease. When the molecular weight is too high, the viscosity when the resin composition is formed into a varnish and the viscosity of the resin composition at the time of heat molding tend to be too high. The weight average molecular weight may be measured by a general molecular weight measurement method, and specific examples thereof include a value measured by gel permeation chromatography (GPC).

As the styrene-based elastomer, a commercially available product can be used, or, for example, V9827, V9461, 2002, and 7125F manufactured by Kuraray Co., Ltd., FTR2140 and FTR6125 manufactured by Mitsui Chemicals Inc., and H1041 manufactured by Asahi Kasei Corp. may be used.

The content of the styrene-based elastomer is not particularly limited, but is, for example, preferably 5 to 40 parts by mass, more preferably 10 to 30 parts by mass with respect to 100 parts by mass of the sum of the polymer and the curing agent. When the modified polyphenylene ether compound is also contained in the resin composition, the content of the styrene-based elastomer is preferably 5 to 40 parts by mass, more preferably 10 to 30 parts by mass with respect to 100 parts by mass of the sum of the polymer, the modified polyphenylene ether compound, and the curing agent. When the content of the styrene-based elastomer is within the above range, a cured product is obtained in which the dielectric loss tangent is far lower and the increase in dielectric loss tangent due to water absorption is sufficiently suppressed even after a water absorption treatment.

As described above, the resin composition according to the present embodiment may contain a flame retardant. The flame retardancy of a cured product of the resin composition can be enhanced by containing a flame retardant. The flame retardant is not particularly limited. Specifically, in the field in which halogen-based flame retardants such as bromine-based flame retardants are used, for example, ethylenedipentabromobenzene, ethylenebistetrabromoimide, decabromodiphenyloxide, and tetradecabromodiphenoxybenzene which have a melting point of 300° C. or more are preferable. It is considered that the elimination of halogen at a high temperature and the decrease in heat resistance can be suppressed by the use of a halogen-based flame retardant. In the field of being required to be free of halogen, a phosphoric ester-based flame retardant, a phosphazene-based flame retardant, a bis(diphenylphosphine oxide)-based flame retardant, and a phosphinate-based flame retardant are exemplified. Specific examples of the phosphoric ester-based flame retardant include a condensed phosphoric ester such as dixylenyl phosphate. Specific examples of the phosphazene-based flame retardant include phenoxyphosphazene. Specific examples of the bis(diphenylphosphine oxide)-based flame retardant include xylylenebis(diphenylphosphine oxide). Specific examples of the phosphinate-based flame retardant include metal phosphinates such as aluminum dialkyl phosphinate. As the flame retardant, the respective flame retardants exemplified may be used singly or in combination of two or more thereof.

As described above, the resin composition according to the present embodiment may contain an initiator (reaction initiator). Even when the resin composition contains only the polymer and the curing agent, the curing reaction may proceed. Even when the resin composition contains only the polymer, the curing reaction may proceed. However, a reaction initiator may be added since there is a case where it is difficult to raise the temperature until curing proceeds depending on the process conditions. The reaction initiator is not particularly limited as long as it can promote the curing reaction between the polymer and the curing agent. Specific examples thereof include oxidizing agents such as α,α'-bis(t-butylperoxy-m-isopropyl)benzene, 2,5-dimethyl-2,5-di(t-butylperoxy)-3-hexyne, benzoyl peroxide, 3,3',5,5'-tetramethyl-1,4-diphenoquinone, chloranil, 2,4,6-tri-t-butylphenoxyl, t-butylperoxyisopropyl monocarbonate, and azobisisobutyronitrile. Moreover, a metal carboxylate can be concurrently used if necessary. By doing so, the curing reaction can be further promoted. Among these, α,α'-bis(t-butylperoxy-m-isopropyl)benzene is preferably used. α,α'-bis(t-butylperoxy-m-isopropyl)benzene has a relatively high reaction initiation temperature and thus can suppress the promotion of the curing reaction at the time point at which curing is not required, for example, at the time of prepreg drying, and can suppress a decrease in the storage stability of the polyphenylene ether resin composition. α,α'-bis(t-butylperoxy-m-isopropyl)benzene exhibits low volatility, thus does not volatilize at the time of prepreg drying and storage, and exhibits favorable stability. The reaction initiators may be used singly or in combination of two or more thereof.

The content of the initiator is not particularly limited, but is, for example, preferably 0.1 to 1.8 parts by mass, more preferably 0.1 to 1.5 parts by mass, still more preferably 0.3 to 1.5 parts by mass with respect to 100 parts by mass of the total mass of the polymer, the curing agent, and the modified polyphenylene ether compound. When the content of the initiator is too low, the curing reaction between the polymer and the curing agent tends not to start suitably. When the content of the initiator is too high, the dielectric loss tangent of the cured product of the obtained prepreg becomes large and excellent low dielectric properties tend to be hardly exhibited. Hence, when the content of the initiator is within the above range, a cured product of a prepreg exhibiting excellent low dielectric properties is obtained.

(Production Method)

The method for producing the resin composition is not particularly limited, and examples thereof include a method in which the polymer and the curing agent are mixed together so as to have predetermined contents. Specific examples thereof include the method to be described later in the case of obtaining a varnish-like composition containing an organic solvent.

Examples of the resin composition according to the present embodiment include the following second resin composition in addition to the resin composition (first resin composition). The second resin composition is a resin composition which contains a polymer having a structural unit represented by Formula (1) in the molecule and an inorganic filler containing silica, and in which the ratio of the number of silanol groups to the number of Si atoms is 3% or less in the inorganic filler extracted from the resin composition or a semi-cured product of the resin composition.

The second resin composition is the same as the first resin composition except for the inorganic filler. The inorganic filler is also an inorganic filler containing silica and is not particularly limited as long as the ratio of the number of silanol groups to the number of Si atoms is 3% or less in the inorganic filler extracted from the resin composition or a semi-cured product of the resin composition. Examples of the inorganic filler contained in the second resin composition include an inorganic filler similar to the inorganic filler contained in the first resin composition. Examples of the method for extracting the inorganic filler from the resin composition or a semi-cured product of the resin composition include a method in which the resin composition or a semi-cured product of the resin composition is subjected to ultrasonic cleaning, the obtained cleaning liquid is filtered, and the solid obtained (isolated by filtration) is dried.

As described above, in this second resin composition, the inorganic filler contains silica and the ratio of the number of silanol groups to the number of Si atoms is 3% or less in the inorganic filler extracted from the resin composition or a semi-cured product of the resin composition. From this fact, as the second resin composition, similar to the first resin composition, in which the inorganic filler contains silica in which the ratio of the number of silanol groups to the number of Si atoms is 3% or less, a resin composition is obtained which provides a cured product which exhibits low dielectric properties and high heat resistance and can suitably maintain the low dielectric properties even after a water absorption treatment.

Moreover, by using the resin composition according to the present embodiment, a prepreg, a metal-clad laminate, a wiring board, a metal foil with resin, and a film with resin can be obtained as described below.

[Prepreg]

Figure 2:
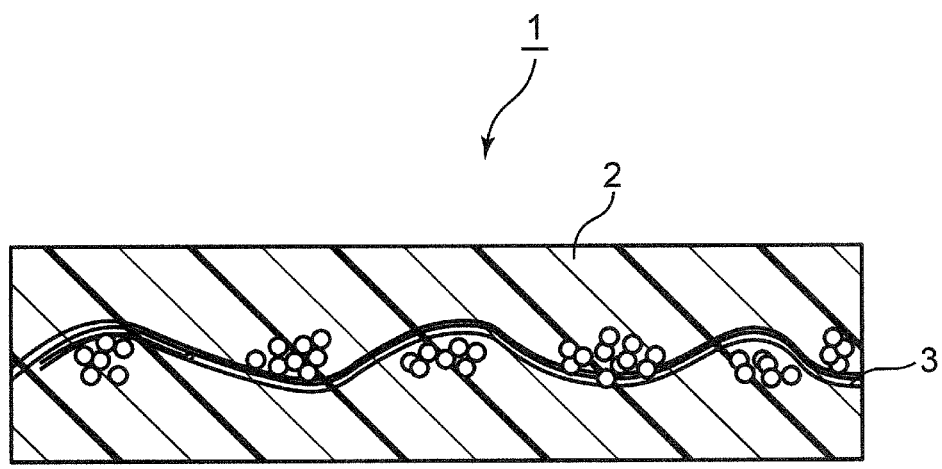
FIG. 2 is a schematic sectional view illustrating an example of a prepreg according to an embodiment of the present invention.

FIG. 2 is a schematic sectional view illustrating an example of a prepreg 1 according to an embodiment of the present invention.

As illustrated in FIG. 2, the prepreg 1 according to the present embodiment includes the resin composition or a semi-cured product 2 of the resin composition and a fibrous base material 3. This prepreg 1 includes the resin composition or the semi-cured product 2 of the resin composition and the fibrous base material 3 present in the resin composition or the semi-cured product 2 of the resin composition.

In the present embodiment, the semi-cured product is in a state in which the resin composition has been cured to an extent that the resin composition can be further cured. In other words, the semi-cured product is in a state in which the resin composition has been semi-cured (B-staged). For example, when the resin composition is heated, the viscosity gradually decreases at the beginning, then curing starts, and the viscosity gradually increases. In such a case, the semi-cured state includes a state in which the viscosity has started to increase but curing is not completed, and the like.

The prepreg to be obtained using the resin composition according to the present embodiment may include a semi-cured product of the resin composition as described above or include the uncured resin composition itself. In other words, the prepreg may be a prepreg including a semi-cured product of the resin composition (the B-stage resin composition) and a fibrous base material or a prepreg including the resin composition before being cured (the A-stage resin composition) and a fibrous base material. The resin composition or a semi-cured product of the resin composition may be one obtained by drying or heating and drying the resin composition.

When a prepreg is manufactured, the resin composition 2 is often prepared in a varnish form and used in order to be impregnated into the fibrous base material 3 which is a base material for forming the prepreg. In other words, the resin composition 2 is usually a resin varnish prepared in a varnish form in many cases. Such a varnish-like resin composition (resin varnish) is prepared, for example, as follows.

First, the respective components which can be dissolved in an organic solvent are introduced into and dissolved in an organic solvent. At this time, heating may be performed if necessary. Thereafter, components which are used if necessary but are not dissolved in the organic solvent are added to and dispersed in the solution until a predetermined dispersion state is achieved using a ball mill, a bead mill, a planetary mixer, a roll mill or the like, whereby a varnish-like resin composition is prepared. The organic solvent used here is not particularly limited as long as it dissolves the polymer, the curing agent and the like, and does not inhibit the curing reaction. Specific examples thereof include toluene and methyl ethyl ketone (MEK).

The method for manufacturing the prepreg is not particularly limited as long as the prepreg can be manufactured. Specifically, when manufacturing a prepreg, the resin composition which has been described above and is used in the present embodiment is often prepared in a varnish form and used as a resin varnish as described above.

Specific examples of the fibrous base material include glass cloth, aramid cloth, polyester cloth, a glass nonwoven fabric, an aramid nonwoven fabric, a polyester nonwoven fabric, pulp paper, and linter paper. When glass cloth is used, a laminate exhibiting excellent mechanical strength is obtained, and glass cloth subjected to flattening is particularly preferable. Specific examples of the flattening include a method in which glass cloth is continuously pressed at an appropriate pressure using a press roll to flatly compress the yarn. The thickness of the generally used fibrous base material is, for example, 0.01 mm or more and 0.3 mm or less.

The method for manufacturing the prepreg is not particularly limited as long as the prepreg can be manufactured. Specifically, when manufacturing a prepreg, the resin composition according to the present embodiment described above is often prepared in a varnish form and used as a resin varnish as described above.

Examples of the method for manufacturing the prepreg 1 include a method in which the fibrous base material 3 is impregnated with the resin composition 2, for example, the resin composition 2 prepared in a varnish form, and then dried. The fibrous base material 3 is impregnated with the resin composition 2 by dipping, coating, and the like. If necessary, the impregnation can be repeated a plurality of times. Moreover, at this time, it is also possible to finally adjust the composition and impregnated amount to the desired composition and impregnated amount by repeating impregnation using a plurality of resin compositions having different compositions and concentrations.

The fibrous base material 3 impregnated with the resin composition (resin varnish) 2 is heated under desired heating conditions, for example, at 80° C. or more and 180° C. or less for 1 minute or more and 10 minutes or less. By heating, the prepreg 1 before being cured (A-stage) or in a semi-cured state (B-stage) is obtained. By the heating, the organic solvent can be decreased or removed by being volatilized from the resin varnish.

The resin composition according to the present embodiment is a resin composition suitably providing a cured product which exhibits low dielectric properties and high heat resistance and can suitably maintain the low dielectric properties even after a water absorption treatment. Hence, the prepreg including this resin composition or a semi-cured product of this resin composition is a prepreg suitably providing a cured product which exhibits low dielectric properties and high heat resistance and can suitably maintain the low dielectric properties even after a water absorption treatment. Moreover, this prepreg is a prepreg from which a wiring board including an insulating layer which exhibits low dielectric properties and high heat resistance and can suitably maintain the low dielectric properties even after a water absorption treatment can be manufactured.

[Metal-Clad Laminate]

Figure 3:
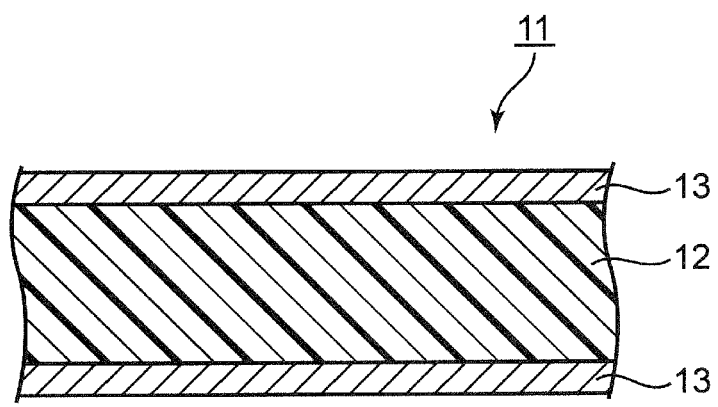
FIG. 3 is a schematic sectional view illustrating an example of a metal-clad laminate according to the embodiment of the present invention.

FIG. 3 is a schematic sectional view illustrating an example of a metal-clad laminate 11 according to an embodiment of the present invention.

As illustrated in FIG. 3, the metal-clad laminate 11 includes an insulating layer 12 containing a cured product of the prepreg 1 illustrated in FIG. 2 and a metal foil 13 to be laminated together with the insulating layer 12. In other words, the metal-clad laminate 11 includes the insulating layer 12 containing a cured product of a resin composition and the metal foil 13 provided on the insulating layer 12. The insulating layer 12 may be formed of a cured product of the resin composition or a cured product of the prepreg. The thickness of the metal foil 13 varies depending on the performance and the like to be required for the finally obtained wiring board and is not particularly limited. The thickness of the metal foil 13 can be appropriately set depending on the desired purpose and is preferably, for example, 0.2 to 70 μm. Examples of the metal foil 13 include a copper foil and an aluminum foil, and the metal foil 13 may be a copper foil with carrier which includes a release layer and a carrier for the improvement in handleability in a case where the metal foil is thin.

The method for manufacturing the metal-clad laminate 11 is not particularly limited as long as the metal-clad laminate 11 can be manufactured. Specific examples thereof include a method in which the metal-clad laminate 11 is fabricated using the prepreg 1. Examples of this method include a method in which the double-sided metal foil-clad or single-sided metal foil-clad laminate 11 is fabricated by stacking one sheet or a plurality of sheets of prepreg 1, further stacking the metal foil 13 such as a copper foil on both or one of upper and lower surfaces of the prepregs 1, and laminating and integrating the metal foils 13 and prepregs 1 by heating and pressing. In other words, the metal-clad laminate 11 is obtained by laminating the metal foil 13 on the prepreg 1 and then performing heating and pressing. The heating and pressing conditions can be appropriately set depending on the thickness of the metal-clad laminate 11 to be manufactured, the kind of the composition of the prepreg 1, and the like. For example, it is possible to set the temperature to 170° C. to 210° C., the pressure to 3.5 to 4 MPa, and the time to 60 to 150 minutes. The metal-clad laminate may be manufactured without using a prepreg. Examples thereof include a method in which a varnish-like resin composition is applied on a metal foil to form a layer containing the resin composition on the metal foil and then heating and pressing is performed.

The resin composition according to the present embodiment is a resin composition suitably providing a cured product which exhibits low dielectric properties and high heat resistance and can suitably maintain the low dielectric properties even after a water absorption treatment. Hence, a metal-clad laminate including an insulating layer containing a cured product of this resin composition is a metal-clad laminate including an insulating layer which exhibits low dielectric properties and high heat resistance and can suitably maintain the low dielectric properties even after a water absorption treatment. Moreover, this metal-clad laminate is a metal-clad laminate from which a wiring board including an insulating layer which exhibits low dielectric properties and high heat resistance and can suitably maintain the low dielectric properties even after a water absorption treatment can be manufactured.

[Wiring Board]

Figure 4:
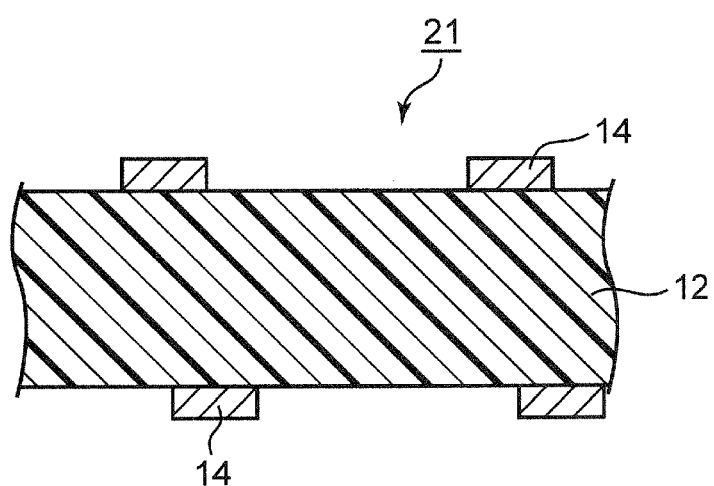
FIG. 4 is a schematic sectional view illustrating an example of a wiring board according to the embodiment of the present invention.

FIG. 4 is a schematic sectional view illustrating an example of a wiring board 21 according to an embodiment of the present invention.

As illustrated in FIG. 4, the wiring board 21 according to the present embodiment includes an insulating layer 12 in which the prepreg 1 illustrated in FIG. 2 is used by curing and wiring 14 which is laminated together with the insulating layer 12 and is formed by removing a part of the metal foil 13. In other words, the wiring board 21 includes the insulating layer 12 containing a cured product of a resin composition and the wiring 14 provided on the insulating layer 12. The insulating layer 12 may be formed of a cured product of the resin composition or a cured product of the prepreg.

The method for manufacturing the wiring board 21 is not particularly limited as long as the wiring board 21 can be manufactured. Specific examples thereof include a method in which the wiring board 21 is fabricated using the prepreg 1. Examples of this method include a method in which the wiring board 21, in which wiring is provided as a circuit on the surface of the insulating layer 12, is fabricated by forming wiring through etching and the like of the metal foil 13 on the surface of the metal-clad laminate 11 fabricated in the manner described above. In other words, the wiring board 21 is obtained by partially removing the metal foil 13 on the surface of the metal-clad laminate 11 and thus forming a circuit. Examples of the method for forming a circuit include circuit formation by a semi-additive process (SAP) or a modified semi-additive process (MSAP) in addition to the method described above. The wiring board 21 includes the insulating layer 12 which exhibits low dielectric properties and high heat resistance and can suitably maintain the low dielectric properties even after a water absorption treatment.

Such a wiring board is a wiring board including an insulating layer which exhibits low dielectric properties and high heat resistance and can suitably maintain the low dielectric properties even after a water absorption treatment.

[Metal Foil with Resin]

Figure 5:
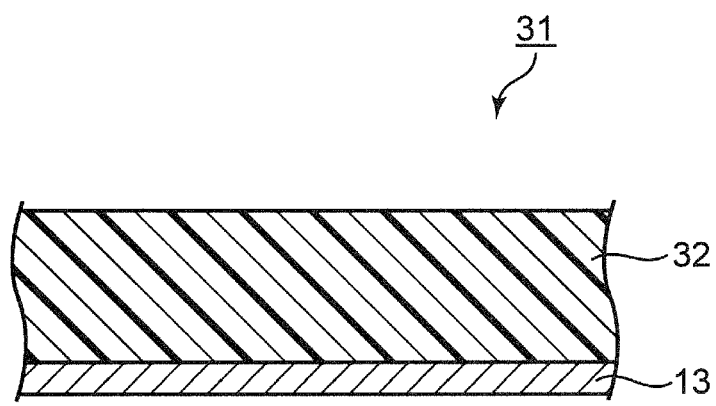
FIG. 5 is a schematic sectional view illustrating an example of a metal foil with resin according to the embodiment of the present invention.

FIG. 5 is a schematic sectional view illustrating an example of a metal foil with resin 31 according to the present embodiment.

The metal foil with resin 31 according to the present embodiment includes a resin layer 32 containing the resin composition or a semi-cured product of the resin composition and a metal foil 13 as illustrated in FIG. 5. The metal foil with resin 31 includes the metal foil 13 on the surface of the resin layer 32. In other words, the metal foil with resin 31 includes the resin layer 32 and the metal foil 13 to be laminated together with the resin layer 32. The metal foil with resin 31 may include other layers between the resin layer 32 and the metal foil 13.

The resin layer 32 may contain a semi-cured product of the resin composition as described above or may contain the uncured resin composition. In other words, the metal foil with resin 31 may be a metal foil with resin including a resin layer containing a semi-cured product of the resin composition (the B-stage resin composition) and a metal foil or a metal foil with resin including a resin layer containing the resin composition before being cured (the A-stage resin composition) and a metal foil. The resin layer is only required to contain the resin composition or a semi-cured product of the resin composition and may or may not contain a fibrous base material. The resin composition or a semi-cured product of the resin composition may be one obtained by drying or heating and drying the resin composition. As the fibrous base material, those similar to the fibrous base materials of the prepreg can be used.

As the metal foil, metal foils to be used in metal-clad laminates can be used without being limited. Examples of the metal foil include a copper foil and an aluminum foil.

The metal foil with resin 31 and a film with resin 41 may include a cover film and the like if necessary. By including a cover film, it is possible to prevent entry of foreign matter and the like. The cover film is not particularly limited, and examples thereof include a polyolefin film, a polyester film, a polymethylpentene film, and films formed by providing a release agent layer on these films.

The method for manufacturing the metal foil with resin 31 is not particularly limited as long as the metal foil with resin 31 can be manufactured. Examples of the method for manufacturing the metal foil with resin 31 include a method in which the varnish-like resin composition (resin varnish) is applied on the metal foil 13 and heated to manufacture the metal foil with resin 31. The varnish-like resin composition is applied on the metal foil 13 using, for example, a bar coater. The applied resin composition is heated under the conditions of, for example, 80° C. or more and 180° C. or less and 1 minute or more and 10 minutes or less. The heated resin composition is formed as the uncured resin layer 32 on the metal foil 13. By the heating, the organic solvent can be decreased or removed by being volatilized from the resin varnish.

The resin composition according to the present embodiment is a resin composition suitably providing a cured product which exhibits low dielectric properties and high heat resistance and can suitably maintain the low dielectric properties even after a water absorption treatment. Hence, the metal foil with resin including a resin layer containing this resin composition or a semi-cured product of this resin composition is a metal foil with resin suitably providing a cured product which exhibits low dielectric properties and high heat resistance and can suitably maintain the low dielectric properties even after a water absorption treatment. Moreover, this metal foil with resin can be used when manufacturing a wiring board including an insulating layer which exhibits low dielectric properties and high heat resistance and can suitably maintain the low dielectric properties even after a water absorption treatment. For example, by laminating the metal foil with resin on a wiring board, a multilayer wiring board can be manufactured. As a wiring board obtained by using such a metal foil with resin, a wiring board including an insulating layer which exhibits low dielectric properties and high heat resistance and can suitably maintain the low dielectric properties even after a water absorption treatment is obtained.

[Film with Resin]

Figure 6:
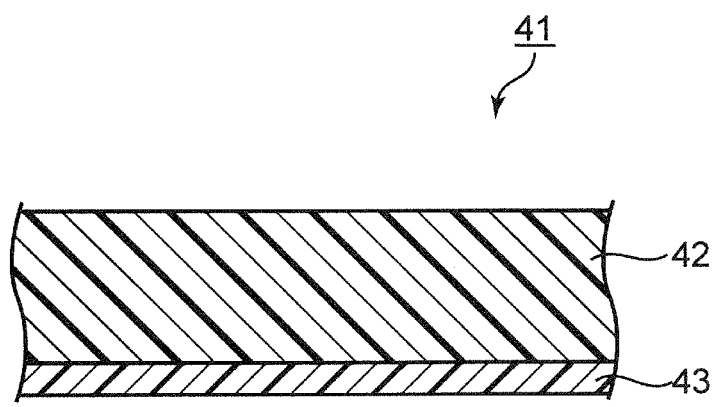
FIG. 6 is a schematic sectional view illustrating an example of a film with resin according to the embodiment of the present invention.

FIG. 6 is a schematic sectional view illustrating an example of a film with resin 41 according to the present embodiment.

The film with resin 41 according to the present embodiment includes a resin layer 42 containing the resin composition or a semi-cured product of the resin composition and a support film 43 as illustrated in FIG. 6. The film with resin 41 includes the resin layer 42 and the support film 43 to be laminated together with the resin layer 42. The film with resin 41 may include other layers between the resin layer 42 and the support film 43.

The resin layer 42 may contain a semi-cured product of the resin composition as described above or may contain the uncured resin composition. In other words, the film with resin 41 may be a film with resin including a resin layer containing a semi-cured product of the resin composition (the B-stage resin composition) and a support film or a film with resin including a resin layer containing the resin composition before being cured (the A-stage resin composition) and a support film. The resin layer is only required to contain the resin composition or a semi-cured product of the resin composition and may or may not contain a fibrous base material. The resin composition or a semi-cured product of the resin composition may be one obtained by drying or heating and drying the resin composition. As the fibrous base material, those similar to the fibrous base materials of the prepreg can be used.

As the support film 43, support films to be used in films with resin can be used without being limited. Examples of the support film include electrically insulating films such as a polyester film, a polyethylene terephthalate (PET) film, a polyimide film, a polyparabanic acid film, a polyether ether ketone film, a polyphenylene sulfide film, a polyamide film, a polycarbonate film, and a polyarylate film.

The film with resin 41 may include a cover film and the like if necessary. By including a cover film, it is possible to prevent entry of foreign matter and the like. The cover film is not particularly limited, and examples thereof include a polyolefin film, a polyester film, and a polymethylpentene film.

The support film and the cover film may be those subjected to surface treatments such as a matt treatment, a corona treatment, a release treatment, and a roughening treatment if necessary.

The method for manufacturing the film with resin 41 is not particularly limited as long as the film with resin 41 can be manufactured. Examples of the method for manufacturing the film with resin 41 include a method in which the varnish-like resin composition (resin varnish) is applied on the support film 43 and heated to manufacture the film with resin 41. The varnish-like resin composition is applied on the support film 43 using, for example, a bar coater. The applied resin composition is heated under the conditions of, for example, 80° C. or more and 180° C. or less and 1 minute or more and 10 minutes or less. The heated resin composition is formed as the uncured resin layer 42 on the support film 43. By the heating, the organic solvent can be decreased or removed by being volatilized from the resin varnish.

The resin composition according to the present embodiment is a resin composition suitably providing a cured product which exhibits low dielectric properties and high heat resistance and can suitably maintain the low dielectric properties even after a water absorption treatment. Hence, the film with resin including a resin layer containing this resin composition or a semi-cured product of this resin composition is a film with resin suitably providing a cured product which exhibits low dielectric properties and high heat resistance and can suitably maintain the low dielectric properties even after a water absorption treatment. Moreover, this film with resin can be used when manufacturing a wiring board including an insulating layer which exhibits low dielectric properties and high heat resistance and can suitably maintain the low dielectric properties even after a water absorption treatment. A multilayer wiring board can be manufactured, for example, by laminating the film with resin on a wiring board and then peeling off the support film from the film with resin or by peeling off the support film from the film with resin and then laminating the film with resin on a wiring board. As a wiring board obtained by using such a film with resin, a wiring board including an insulating layer which exhibits low dielectric properties and high heat resistance and can suitably maintain the low dielectric properties even after a water absorption treatment is obtained.

The present specification discloses various aspects of a technique as described above, but the main technique is summarized below.

An aspect of the present invention is a resin composition containing a polymer having a structural unit represented by the following Formula (1) in the molecule, and an inorganic filler, in which the inorganic filler contains silica in which a ratio of a number of Si atoms contained in silanol groups to a total number of Si atoms is 3% or less.

[Chem. 25]

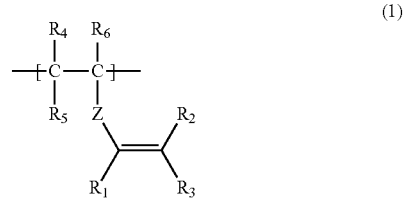

In Formula (1), Z represents an arylene group, $R_1$ to $R_3$ each independently represent a hydrogen atom or an alkyl group, and $R_4$ to $R_6$ each independently represent a hydrogen atom or an alkyl group having 1 to 6 carbon atoms.

According to such a configuration, it is possible to provide a resin composition providing a cured product which exhibits low dielectric properties and high heat resistance and can suitably maintain the low dielectric properties even after a water absorption treatment.

In the resin composition, the content of the silica is preferably 10 to 400 parts by mass with respect to 100 parts by mass of the components other than the inorganic filler in the resin composition.

According to such a configuration, a resin composition providing a cured product which exhibits low dielectric properties and higher heat resistance and can more suitably maintain the low dielectric properties even after a water absorption treatment is obtained.

Another aspect of the present invention is a resin composition containing a polymer having a structural unit represented by Formula (1) in a molecule, and an inorganic filler containing silica, in which a ratio of a number of Si atoms contained in the silanol groups to a total number of Si atoms is 3% or less in the inorganic filler extracted from the resin composition or a semi-cured product of the resin composition.

According to such a configuration, it is possible to provide a resin composition providing a cured product which exhibits low dielectric properties and high heat resistance and can suitably maintain the low dielectric properties even after a water absorption treatment.

In the resin composition, the structural unit represented by Formula (1) preferably includes a structural unit represented by the following Formula (2).

[Chem. 26]

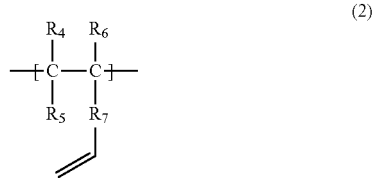

(2)

In Formula (2), $R_4$ to $R_6$ each independently represent a hydrogen atom or an alkyl group having 1 to 6 carbon atoms and $R_7$ represents an arylene group having 6 to 12 carbon atoms.

According to such a configuration, it is possible to obtain a resin composition which provides a cured product exhibiting low dielectric properties and high heat resistance.

In the resin composition, the structural unit represented by Formula (2) preferably includes a structural unit represented b the following Formula (3).

[Chem. 27]

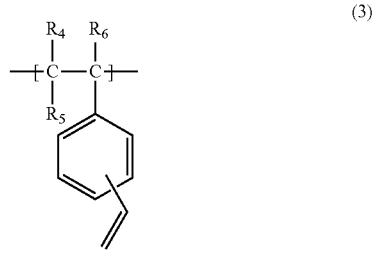

(3)

In Formula (3), $R_4$ to $R_6$ each independently represent a hydrogen atom or an alkyl group having 1 to 6 carbon atoms.

According to such a configuration, it is possible to obtain a resin composition which provides a cured product exhibiting low dielectric properties and high heat resistance.

In the resin composition, the polymer preferably includes a polymer having a structural unit represented by the following Formula (4) in a molecule.

[Chem. 28]

(4)

In Formula (4), $R_8$ to $R_{10}$ each independently represent a hydrogen atom or an alkyl group having 1 to 6 carbon atoms and $R_{11}$ represents an aryl group.

According to such a configuration, it is possible to obtain a resin composition which provides a cured product exhibiting low dielectric properties and high heat resistance.

In the resin composition, the aryl group in the structural unit represented by Formula (4) preferably has an alkyl group having 1 to 6 carbon atoms.

According to such a configuration, it is possible to obtain a resin composition which provides a cured product exhibiting low dielectric properties and high heat resistance.

In the resin composition, the weight average molecular weight of the polymer is preferably 1,500 to 40,000.

According to such a configuration, a resin composition is obtained which exhibits excellent moldability and provides a cured product which exhibits low dielectric properties and high heat resistance and can suitably maintain the low dielectric properties even after a water absorption treatment.

In the resin composition, an equivalent of the vinyl group included in the structural unit represented by Formula (1), where $R_1$ to $R_3$ are a hydrogen atom, of the polymer is preferably 250 to 1200.

According to such a configuration, a resin composition is obtained which exhibits excellent moldability and provides a cured product which exhibits low dielectric properties and high heat resistance and can suitably maintain the low dielectric properties even after a water absorption treatment.

In the resin composition, the content of the polymer is preferably 10 to 95 parts by mass with respect to 100 parts by mass of the components other than the inorganic filler in the resin composition.

According to such a configuration, a resin composition providing a cured product which exhibits lower dielectric properties and higher heat resistance and can more suitably maintain the low dielectric properties even after a water absorption treatment is obtained.

It is preferable that the resin composition further contains a modified polyphenylene ether compound of which the terminal is modified with a substituent having a carbon-carbon unsaturated double bond.

According to such a configuration, a resin composition providing a cured product which exhibits lower dielectric properties and higher heat resistance and can more suitably maintain the low dielectric properties even after a water absorption treatment is obtained.

It is preferable that the resin composition further contains a curing agent, and the curing agent contains at least one selected from the group consisting of a polyfunctional acrylate compound having two or more acryloyl groups in the molecule, a polyfunctional methacrylate compound having two or more methacryloyl groups in the molecule, a polyfunctional vinyl compound having two or more vinyl groups in the molecule, a styrene derivative, an allyl compound having an allyl group in the molecule, a maleimide compound having a maleimide group in the molecule, an acenaphthylene compound having an acenaphthylene structure in the molecule, and an isocyanurate compound having an isocyanate group in the molecule.

According to such a configuration, a cured product, which exhibits low dielectric properties and higher heat resistance and can suitably maintain the low dielectric properties even after a water absorption treatment, is obtained.

In the resin composition, the content of the curing agent is preferably 5 to 50 parts by mass with respect to 100 parts by mass of the components other than the inorganic filler in the resin composition.

According to such a configuration, a cured product, which exhibits low dielectric properties and higher heat resistance and can suitably maintain the low dielectric properties even after a water absorption treatment, is obtained.

Another aspect of the present invention is a prepreg including the resin composition or a semi-cured product of the resin composition, and a fibrous base material.

According to such a configuration, it is possible to provide a prepreg suitably providing a cured product which exhibits low dielectric properties and high heat resistance and can suitably maintain the low dielectric properties even after a water absorption treatment.

Another aspect of the present invention is a film with resin including a resin layer containing the resin composition or a semi-cured product of the resin composition, and a support film.

According to such a configuration, it is possible to provide a film with resin suitably providing a cured product which exhibits low dielectric properties and high heat resistance and can suitably maintain the low dielectric properties even after a water absorption treatment.

Another aspect of the present invention is a metal foil with resin including a resin layer containing the resin composition or a semi-cured product of the resin composition, and a metal foil.

According to such a configuration, it is possible to provide a metal foil with resin suitably providing a cured product which exhibits low dielectric properties and high heat resistance and can suitably maintain the low dielectric properties even after a water absorption treatment.

Another aspect of the present invention is a metal-clad laminate including an insulating layer containing a cured product of the resin composition or a cured product of the prepreg, and a metal foil.

According to such a configuration, it is possible to provide a metal-clad laminate including an insulating layer which exhibits low dielectric properties and high heat resistance and can suitably maintain the low dielectric properties even after a water absorption treatment.

Another aspect of the present invention is a wiring board including an insulating layer containing a cured product of the resin composition or a cured product of the prepreg, and wiring.

According to such a configuration, it is possible to provide a wiring board including an insulating layer which exhibits low dielectric properties and high heat resistance and can suitably maintain the low dielectric properties even after a water absorption treatment.

According to the present invention, it is possible to provide a resin composition providing a cured product which exhibits low dielectric properties and high heat resistance and can suitably maintain the low dielectric properties even after a water absorption treatment. According to the present invention, it is possible to provide a prepreg, a film with resin, a metal foil with resin, a metal-clad laminate, and a wiring board which are obtained using the resin composition.

Hereinafter, the present invention will be described more specifically with reference to examples, but the scope of the present invention is not limited thereto.

EXAMPLES

Examples 1 to 12 and Comparative Examples 1 to 7

The respective components to be used when preparing a resin composition in the present examples will be described.
(Resin Component)
Polymer 1: Polymer Obtained by the Following Method.
Into a 5.0 L reactor, 2.9 mol (377 g) of divinylbenzene, 1.7 mol (224.4 g) of ethylvinylbenzene, 10.4 mol (1081.6 g) of styrene, and 15 mol (1532 g) of n-propyl acetate were added, and stirring was performed. The mixture obtained by this stirring was heated to 70° C., then 600 mmol of boron trifluoride-diethyl ether complex was added thereto, and stirring was performed at 70° C. for 4 hours to react divinylbenzene, ethylvinylbenzene, and styrene. Thereafter, a saturated aqueous sodium hydrogen carbonate solution was added to the reaction solution in the reactor to stop the reaction. The organic layer separated by the addition was washed with pure water three times. The washed organic layer was volatilized under reduced pressure at 60° C. to obtain polymer 1.

The obtained polymer 1 was a polymer having a structural unit represented by Formula (1) in the molecule [an aromatic polymer having a structural unit derived from a bifunctional aromatic compound in which two carbon-carbon unsaturated double bonds are bonded to an aromatic ring, a compound having structural units represented by Formulas (5) to (7), weight average molecular weight Mw: 26300, vinyl equivalent (equivalent of the vinyl group included in the structural unit represented by Formula (1), where $R_1$ to $R_3$ are a hydrogen atom: 510).

Polymer 2: Polymer Obtained by the Following Method.
Into a 5.0 L reactor, 3.6 mol (468 g) of divinylbenzene, 2.2 mol (290.4 g) of ethylvinylbenzene, 9.2 mol (956.8 g) of styrene, and 15 mol (1532 g) of n-propyl acetate were added, and stirring was performed. The mixture obtained by this stirring was heated to 70° C., then 600 mmol of boron trifluoride-diethyl ether complex was added thereto, and stirring was performed at 70° C. for 4 hours to react divinylbenzene, ethylvinylbenzene, and styrene. Thereafter, a saturated aqueous sodium hydrogen carbonate solution was added to the reaction solution in the reactor to stop the reaction. The organic layer separated by the addition was then washed with pure water three times. The washed organic layer was volatilized under reduced pressure at 60° C. to obtain polymer 2.

The obtained polymer 2 was a polymer having a structural unit represented by Formula (1) in the molecule [an aromatic polymer having a structural unit derived from a bifunctional aromatic compound in which two carbon-carbon unsaturated double bonds are bonded to an aromatic ring, a compound having structural units represented by Formulas (5) to (7), weight average molecular weight Mw: 31100, vinyl equivalent (equivalent of the vinyl group included in the structural unit represented by Formula (1), where $R_1$ to $R_3$ are a hydrogen atom: 380).

Polymer 3: Polymer Obtained by the Following Method.
Into a 5.0 L reactor, 3.9 mol (507 g) of divinylbenzene, 2.3 mol (303.6 g) of ethylvinylbenzene, 8.8 mol (915.2 g) of styrene, and 15 mol (1532 g) of n-propyl acetate were added, and stirring was performed. The mixture obtained by this stirring was heated to 70° C., then 600 mmol of boron trifluoride-diethyl ether complex was added thereto, and stirring was performed at 70° C. for 4 hours to react divinylbenzene, ethylvinylbenzene, and styrene. Thereafter, a saturated aqueous sodium hydrogen carbonate solution was added to the reaction solution in the reactor to stop the reaction. The organic layer separated by the addition was then washed with pure water three times. The washed organic layer was volatilized under reduced pressure at 60° C. to obtain polymer 3.

The obtained polymer 3 was a polymer having a structural unit represented by Formula (1) in the molecule [an aromatic polymer having a structural unit derived from a bifunctional aromatic compound in which two carbon-carbon unsaturated double bonds are bonded to an aromatic ring, a compound having structural units represented by Formulas (5) to (7), weight average molecular weight Mw: 39500, vinyl equivalent (equivalent of the vinyl group included in the structural unit represented by Formula (1), where $R_1$ to $R_3$ are a hydrogen atom: 320).

The equivalent (vinyl equivalent) of the vinyl group included in the structural unit represented by Formula (1), where $R_1$ to $R_3$ are a hydrogen atom, of the polymers 1 to 3 was calculated through iodine value measurement by the Wyeth method. Specifically, the compound to be measured was first dissolved in chloroform so that the concentration was 0.3 g/30 mL. Excess amount of iodine chloride was added to the double bonds present in this solution. By doing so, the double bond was reacted with iodine chloride, this reaction was allowed to proceed sufficiently, and then an aqueous potassium iodide solution at 20% by mass was added to the solution after being subjected to the reaction to extract the iodine component remaining in the solution after being subjected to the reaction into the aqueous phase in the form of $I_3^-$. This aqueous phase into which $I_3^-$ was extracted was titrated with an aqueous sodium thiosulfate solution (0.1 mol/L sodium thiosulfate standard solution), and the iodine value was calculated. The following equation was used to calculate the iodine value.

$$\text{Iodine value} = [(B-A) \times F \times 1.269]/\text{mass of compound (g)}$$

In the equation, B denotes the titration volume (cc) of the 0.1 mol/L sodium thiosulfate standard solution required for the blank test, A denotes the titration volume (cc) of 0.1 mol/L sodium thiosulfate standard solution required for neutralization, and F denotes the titer of sodium thiosulfate.

Modified PPE1: Polyphenylene ether compound having a vinylbenzyl group (ethenylbenzyl group) at the terminal (a modified polyphenylene ether compound obtained by reacting polyphenylene ether with chloromethylstyrene).

More specifically, a modified polyphenylene ether compound obtained by performing a reaction as follows.

First, 200 g of polyphenylene ether (SA90 manufactured by SABIC Innovative Plastics, number of terminal hydroxyl groups: 2, weight average molecular weight Mw: 1700), 30 g of a mixture containing p-chloromethylstyrene and m-chloromethylstyrene at a mass ratio of 50:50 (chloromethylstyrene: CMS manufactured by Tokyo Chemical Industry Co., Ltd.), 1.227 g of tetra-n-butylammonium bromide as a phase transfer catalyst, and 400 g of toluene were introduced into a 1-liter three-necked flask equipped with a temperature controller, a stirrer, cooling equipment, and a dropping funnel and stirred. The mixture was stirred until polyphenylene ether, chloromethylstyrene, and tetra-n-butylammonium bromide were dissolved in toluene. At that time, the mixture was gradually heated until the liquid temperature finally reached 75° C.

Thereafter, an aqueous sodium hydroxide solution (20 g of sodium hydroxide/20 g of water) as an alkali metal hydroxide was added dropwise to the solution over 20 minutes. Thereafter, the mixture was further stirred at 75° C. for 4 hours. Next, the resultant in the flask was neutralized with hydrochloric acid at 10% by mass and then a large amount of methanol was added into the flask. By doing so, a precipitate was generated in the liquid in the flask. In other words, the product contained in the reaction solution in the flask was reprecipitated. Thereafter, this precipitate was taken out by filtration, washed three times with a mixed solution of methanol and water contained at a mass ratio of 80:20, and then dried under reduced pressure at 80° C. for 3 hours.

The obtained solid was analyzed by $^1$H-NMR (400 Mz, CDCl$_3$, TMS). As a result of NMR measurement, a peak attributed to a vinylbenzyl group (ethenylbenzyl group) was observed at 5 to 7 ppm. This made it possible to confirm that the obtained solid was a modified polyphenylene ether compound having a vinylbenzyl group (ethenylbenzyl group) as the substituent at the molecular terminal in the molecule. Specifically, it was confirmed that the obtained solid was ethenylbenzylated polyphenylene ether. This obtained modified polyphenylene ether compound was a modified polyphenylene ether compound represented by Formula (18), where Y was a dimethylmethylene group (a group represented by Formula (16), where $R_{44}$ and $R_{45}$ were a methyl group), $Z_A$ was a phenylene group, $R_{12}$ to $R_{14}$ were a hydrogen atom, and p was 1.

The number of terminal functional groups in the modified polyphenylene ether was measured as follows.

First, the modified polyphenylene ether was accurately weighed. The weight at that time is defined as X (mg). Thereafter, this modified polyphenylene ether weighed was dissolved in 25 mL of methylene chloride, 100 μL of an ethanol solution of tetraethylammonium hydroxide (TEAH) at 10% by mass (TEAH:ethanol (volume ratio)=15:85) was added to the solution, and then the absorbance (Abs) of this mixture at 318 nm was measured using a UV spectrophotometer (UV-1600 manufactured by Shimadzu Corporation). Thereafter, the number of terminal hydroxyl groups in the modified polyphenylene ether was calculated from the measurement result using the following equation.

$$\text{Residual OH amount } (\mu\text{mol/g}) = [(25 \times \text{Abs})/(\varepsilon \times OPL \times X)] \times 10^6$$

Here, ε indicates the extinction coefficient and is 4700 L/mol·cm. OPL indicates the cell path length and is 1 cm.

Since the calculated residual OH amount (the number of terminal hydroxyl groups) in the modified polyphenylene ether is almost zero, it was found that the hydroxyl groups in the polyphenylene ether before being modified are almost modified. From this fact, it was found that the number of terminal hydroxyl groups decreased from the number of terminal hydroxyl groups in polyphenylene ether before being modified is the number of terminal hydroxyl groups in polyphenylene ether before being modified. In other words, it was found that the number of terminal hydroxyl groups in polyphenylene ether before being modified is the number of terminal functional groups in the modified polyphenylene ether. In other words, the number of terminal functional groups was two.

The intrinsic viscosity (IV) of the modified polyphenylene ether was measured in methylene chloride at 25° C. Specifically, the intrinsic viscosity (IV) of the modified polyphenylene ether was measured in a methylene chloride solution (liquid temperature: 25° C.) of the modified polyphenylene ether at 0.18 g/45 ml using a viscometer (AVS500 Visco System manufactured by SCHOTT Instruments GmbH). As a result, the intrinsic viscosity (IV) of the modified polyphenylene ether was 0.086 dl/g.

The molecular weight distribution of the modified polyphenylene ether was measured by GPC. Moreover, the weight average molecular weight (Mw) was calculated from the obtained molecular weight distribution. As a result, Mw was 1,900.

Modified PPE2: Modified polyphenylene ether obtained by modifying the terminal hydroxyl groups of polyphenylene ether with a methacryl group (a modified polyphenylene ether compound represented by Formula (19), where Y is a dimethylmethylene group (a group represented by Formula (16), where $R_{44}$ and $R_{45}$ are a methyl group), SA9000 manufactured by SABIC Innovative Plastics, weight average molecular weight Mw: 2000, number of terminal functional groups: 2)

Butadiene-styrene oligomer: Ricon 100 manufactured by CRAY VALLEY (Curing Agent)

Acenaphthylene: Acenaphthylene manufactured by JFE Chemical Corporation

Maleimide compound: IMILEX-P manufactured by NIPPON SHOKUBAI CO., LTD.

(Styrene-Based Elastomer)

Styrene-based elastomer: Hydrogenated styrene (ethylene/butylene) styrene copolymer (DYNARON990IP manufactured by JSR Corporation, content of constitutional unit derived from styrene: 53% by mass, weight average molecular weight: 100000)

(Inorganic Filler)

Silica 1: Silica having a silanol group amount of 1.0% (5SV-C5 manufactured by Admatechs Company Limited, silica treated to have low dielectric loss tangent, volume average particle size: 0.5 μm)

Silica 2: Silica having a silanol group amount of 1.4% (10SV-C5 manufactured by Admatechs Company Limited, silica treated to have low dielectric loss tangent, volume average particle size: 1.0 μm)

Silica 3: Silica having a silanol group amount of 1.3% (3SV-C3 manufactured by Admatechs Company Limited, silica treated to have low dielectric loss tangent, volume average particle size: 0.3 μm)

Silica 4: Silica having a silanol group amount of 1.5% (silica treated to have low dielectric loss tangent, volume average particle size: 0.6 μm)

Silica 5: Silica having a silanol group amount of 4.0% (SC2300-SVJ manufactured by Admatechs Company Limited, volume average particle size: 0.5 μm)

Silica 6: Silica having a silanol group amount of 3.9% (10SV-C4 manufactured by Admatechs Company Limited, volume average particle size: 1.0 μm)

The silanol group amount (the ratio of the number of Si atoms contained in the silanol groups to the total number of Si atoms) in Silicas 1 to 6 was measured as follows.

First, each silica was subjected to solid-state $^{29}$Si-NMR measurement by the DD method using CMX300 manufactured by Chemagnetics Inc. to obtain a spectrum of each silica. As the measurement conditions at that time, the DD/MAS (Dipolar Decoupling—Magic Angle Spinning) method was used, the pulse sequence was set to DD/MAS, the resonant frequency was set to 59.6 MHz ($^{29}$Si), the MAS speed was set to 7000 HZ, the number of integrations was set to 360 times, and the delay time was set to 300 seconds. Using LabSpec manufactured by HORIBA, Ltd., the obtained spectrum was approximated to Lorentz type, Gauss type, and a mixed waveform of these, and peak separation and diffraction were performed to determine the peak area (SQ2) of the Q2 structure, the peak area (SQ3) of the Q3 structure, and the peak area (SQ4) of the Q4 structure. Specifically, the area (integrated value) of the peak having a peak top of −90 ppm, the area (integrated value) of the peak having a peak top at −100 ppm, and the area (integrated value) of the peak having a peak top at −110 ppm were determined as SQ2, SQ3, and SQ4. From these peak areas, the ratio (=(SQ2+SQ3)/(SQ2+SQ3+SQ4)×100(%)) of the sum of SQ2 and SQ3 to the sum of SQ2, SQ3, and SQ4 was calculated. This ratio was the proportion of the total number of the Q2 structures and the Q3 structures to the total number of the Q2 structures, the Q3 structures, and the Q4 structures, and was taken as the silanol group amount.

(Preparation Method)

First, the respective components other than the inorganic filler were added to and mixed in toluene at the compositions (parts by mass) presented in Tables 3 and 4 so that the solid concentration was 55% by mass. The mixture was stirred for 60 minutes. Thereafter, the inorganic filler was added to and dispersed in the obtained liquid using a bead mill. By doing so, a varnish-like resin composition (varnish) was obtained.

Next, an evaluation substrate (cured product of prepreg) was obtained as follows.

The obtained varnish was impregnated into a fibrous base material (glass cloth: GC2116L, #2116 type, L Glass manufactured by Asahi Kasei Corporation) and then heated and dried at 110° C. for 3 minutes, thereby fabricating a prepreg. At that time, the content (resin content) of the components constituting the resin with respect to the prepreg was adjusted to be 56% by mass by the curing reaction. Thereafter, each of the obtained prepregs was stacked by six sheets and the stacked body was heated and pressed under the conditions of 200° C., 2 hours, and a pressure of 3 MPa, thereby obtaining an evaluation substrate (cured product of prepreg).

Next, an evaluation substrate (metal-clad laminate) was obtained as follows.

Next, the obtained varnish was impregnated into a fibrous base material (glass cloth: GC1078L, #1078 type, L Glass manufactured by Asahi Kasei Corporation) and then heated and dried at 110° C. for 2 minutes, thereby fabricating a prepreg. At that time, the content (resin content) of the components constituting the resin with respect to the prepreg was adjusted to be 67% by mass by the curing reaction.

Each of the obtained prepregs was stacked by two sheets, and a copper foil (FV-WS manufactured by FURUKAWA ELECTRIC CO., LTD., thickness: 18 μm) was disposed on both sides of the stacked body to form a body to be pressed, and the body to be pressed was heated and pressed under the conditions of 200° C. and a pressure of 3 MPa for 2 hours, thereby fabricating a copper foil-clad laminate, which was an evaluation substrate (metal-clad laminate) in which a copper foil was pasted to both surfaces.

The evaluation substrates (cured product of prepreg and metal-clad laminate) prepared as described above were evaluated by the methods described below.

[Dielectric Loss Tangent Before Water Absorption Treatment]

The dielectric loss tangent of the evaluation substrate (cured product of prepreg) at 10 GHz was measured by the cavity resonator perturbation method. Specifically, the dielectric loss tangent of the evaluation substrate at 10 GHz was measured using a network analyzer (N5230A manufactured by Keysight Technologies).

[Dielectric Loss Tangent after Water Absorption Treatment]

The evaluation substrate used in the measurement of the dielectric loss tangent before a water absorption treatment was subjected to a water absorption treatment with reference to JIS C 6481 (1996), and the dielectric loss tangent (dielectric loss tangent after moisture absorption) of this evaluation substrate subjected to a water absorption treatment was measured by a method similar to that for the measurement of the dielectric loss tangent before a water absorption treatment. As the water absorption treatment, the evaluation substrate was treated in constant temperature air (50° C.) for 24 hours and then in constant temperature water (23° C.) for 24 hours and then the water on the evaluation substrate was thoroughly wiped off with a dry and clean cloth.

[Amount of Change in Dielectric Loss Tangent (after Water Absorption Treatment−Before Water Absorption Treatment)]

The difference between the dielectric loss tangent before a water absorption treatment and the dielectric loss tangent after a water absorption treatment (dielectric loss tangent after water absorption treatment−dielectric loss tangent before water absorption treatment) was calculated.

[Water Absorption Rate (%)]

A laminate obtained by removing the copper foil from the evaluation substrate (metal-clad laminate) was used as the evaluation substrate to measure the water absorption rate in conformity with JIS C 6481 (1996). Specifically, the mass of the evaluation substrate (mass before water absorption treatment) was first measured. This evaluation substrate of which the mass was measured was subjected to the water absorption treatment in the evaluation of the "dielectric loss tangent after water absorption treatment". The mass (mass after water absorption treatment) of the evaluation substrate after this water absorption treatment was measured. The water absorption rate (%) was calculated from the mass before the water absorption treatment and the mass after the water absorption treatment. Specifically, the water absorption rate (%) is the ratio [=(mass after water absorption treatment−mass before water absorption treatment)/mass before water absorption treatment×100(%)] of the difference between the mass after a water absorption treatment and the mass before a water absorption treatment to the mass before a water absorption treatment.

[Moisture Absorption Solder Heat Resistance]

A copper foil-clad laminate (metal foil-clad laminate) having a thickness of about 0.8 mm and a copper foil which had a thickness of 35 μm and was attached to both sides thereof was obtained by setting the number of prepregs to be stacked to six sheets when fabricating the evaluation substrate. This formed copper foil-clad laminate was cut into 50 mm×50 mm and the copper foils on both sides were removed by etching. The laminate for evaluation thus obtained was held for 6 hours under at a temperature of 121° C. and a relative humidity of 100%. Thereafter, this laminate for evaluation was immersed in a solder bath at 288° C. for 10 seconds. The immersed laminate was visually observed to confirm the occurrence of measling and swelling. When the occurrence of measling, swelling and the like was not confirmed, the solder heat resistance was evaluated as "Good". When the occurrence of measling, swelling and the like was confirmed, the solder heat resistance was evaluated as "Poor".

[Glass Transition Temperature (DMA) (Tg)]

The Tg of the prepreg was measured using a viscoelastic spectrometer "DMS6100" manufactured by Seiko Instruments Inc. At this time, a dynamic viscoelasticity measurement (DMA) was performed at a bending module by setting the frequency to 10 Hz, and the temperature at which tan δ was the maximum when the temperature was raised from room temperature to 320° C. under the condition of a rate of temperature rise of 5° C./min was defined as Tg.

[Transmission Loss]

One metal foil (copper foil) of the evaluation substrate (metal-clad laminate) was processed to form ten wirings having a line width of 100 to 300 μm, a line length of 1000 mm, and a line spacing of 20 mm. A three-layer plate was fabricated by secondarily stacking two sheets of prepreg and a metal foil (copper foil) on the surface on the side on which the wiring was formed of the substrate on which this wiring was formed. The line width of the wiring was adjusted so that the characteristic impedance of the circuit after the three-layer plate was fabricated was 50Ω.

The transmission loss (passing loss) (dB/m) of the wiring formed on the obtained three-layer plate at 20 GHz was measured using a network analyzer (N5230A developed by Keysight Technologies).

The results of the respective evaluations are presented in Tables 3 and 4.

TABLE 3

| | | | Example | | | | | |
|---|---|---|---|---|---|---|---|---|
| | | | 1 | 2 | 3 | 4 | 5 | 6 |
| Composition (parts by mass) | Resin component | Polymer 1 | 70 | — | — | — | — | — |
| | | Polymer 2 | — | 70 | 70 | 70 | — | 70 |
| | | Polymer 3 | — | — | — | — | 70 | — |
| | | Modified PPE1 | — | — | — | — | — | — |
| | | Modified PPE2 | — | — | — | — | — | — |
| | Curing agent | Acenaphthylene | 30 | 30 | 30 | 30 | 30 | 30 |
| | | Maleimide compound | — | — | — | — | — | — |
| | | Styrene-based elastomer | — | — | — | — | — | — |
| | Inorganic filler | Silica 1 | 60 | 60 | 40 | 150 | 60 | — |
| | | Silica 2 | — | — | — | — | — | 60 |
| | | Silica 3 | — | — | — | — | — | — |
| | | Silica 4 | — | — | — | — | — | — |
| Evaluation | Dielectric loss tangent before water absorption treatment | | 0.0016 | 0.0016 | 0.0016 | 0.0016 | 0.0016 | 0.0016 |
| | Dielectric loss tangent after water absorption treatment | | 0.0019 | 0.0019 | 0.0019 | 0.0018 | 0.0019 | 0.0019 |
| | Amount of change in dielectric loss tangent (after water absorption treatment − before water absorption treatment) | | 0.0003 | 0.0003 | 0.0003 | 0.0002 | 0.0003 | 0.0003 |
| | Water absorption rate (%) | | 0.02 | 0.02 | 0.02 | 0.01 | 0.02 | 0.02 |
| | Moisture absorption solder heat resistance | | Good | Good | Good | Good | Good | Good |
| | Glass transition temperature (DMA) (° C.) | | 200 | 215 | 215 | 215 | 225 | 215 |
| | Transmission loss (dB/m) | | −23 | −23 | −23 | −24 | −23 | −22 |

TABLE 3-continued

|  |  |  | Example | | | | | |
|---|---|---|---|---|---|---|---|---|
|  |  |  | 7 | 8 | 9 | 10 | 11 | 12 |
| Composition (parts by mass) | Resin component | Polymer 1 | — | — | — | — | — | — |
|  |  | Polymer 2 | 70 | 70 | 70 | 56 | 60 | 60 |
|  |  | Polymer 3 | — | — | — | — | — | — |
|  |  | Modified PPE1 | — | — | — | — | 10 | — |
|  |  | Modified PPE2 | — | — | — | — | — | 10 |
|  | Curing agent | Acenaphthylene | 30 | 30 | — | 24 | 30 | 30 |
|  |  | Maleimide compound | — | — | 30 | — | — | — |
|  |  | Styrene-based elastomer | — | — | — | — | 20 | — |
|  | Inorganic filler | Silica 1 | — | — | 60 | 60 | 60 | 60 |
|  |  | Silica 2 | — | — | — | — | — | — |
|  |  | Silica 3 | 60 | — | — | — | — | — |
|  |  | Silica 4 | — | 60 | — | — | — | — |
| Evaluation | Dielectric loss tangent before water absorption treatment | | 0.0016 | 0.0016 | 0.0016 | 0.0015 | 0.0016 | 0.0016 |
|  | Dielectric loss tangent after water absorption treatment | | 0.0019 | 0.0019 | 0.0019 | 0.0017 | 0.0019 | 0.0019 |
|  | Amount of change in dielectric loss tangent (after water absorption treatment − before water absorption treatment) | | 0.0003 | 0.0003 | 0.0003 | 0.0002 | 0.0003 | 0.0003 |
|  | Water absorption rate (%) | | 0.02 | 0.02 | 0.02 | 0.01 | 0.02 | 0.02 |
|  | Moisture absorption solder heat resistance | | Good | Good | Good | Good | Good | Good |
|  | Glass transition temperature (DMA) (° C.) | | 215 | 215 | 210 | 210 | 215 | 215 |
|  | Transmission loss (dB/m) | | −23 | −23 | −23 | −22 | −23 | −23 |

TABLE 4

|  |  |  | Comparative Example | | | | | | |
|---|---|---|---|---|---|---|---|---|---|
|  |  |  | 1 | 2 | 3 | 4 | 5 | 6 | 7 |
| Composition (parts by mass) | Resin component | Polymer 1 | 70 | — | — | — | — | — | — |
|  |  | Polymer 2 | — | 70 | 70 | 70 | — | 70 | — |
|  |  | Polymer 3 | — | — | — | — | 70 | — | — |
|  |  | Butadiene-styrene oligomer | — | — | — | — | — | — | 70 |
|  | Curing agent | Acenaphthylene | 30 | 30 | 30 | 30 | 30 | 30 | 30 |
|  | Inorganic filler | Silica 1 | — | — | — | — | — | — | 60 |
|  |  | Silica 5 | 60 | 60 | 40 | 150 | 60 | — | — |
|  |  | Silica 6 | — | — | — | — | — | 60 | — |
| Evaluation | Dielectric loss tangent before water absorption treatment | | 0.0019 | 0.0019 | 0.0019 | 0.0020 | 0.0019 | 0.0019 | 0.0018 |
|  | Dielectric loss tangent after water absorption treatment | | 0.0024 | 0.0024 | 0.0025 | 0.0025 | 0.0024 | 0.0024 | 0.0022 |
|  | Amount of change in dielectric loss tangent (after water absorption treatment − before water absorption treatment) | | 0.0005 | 0.0005 | 0.0006 | 0.0005 | 0.0005 | 0.0005 | 0.0004 |
|  | Water absorption rate (%) | | 0.04 | 0.04 | 0.04 | 0.04 | 0.04 | 0.04 | 0.03 |
|  | Moisture absorption solder heat resistance | | Good | Good | Good | Good | Good | Good | Poor |
|  | Glass transition temperature (DMA) (° C.) | | 200 | 215 | 215 | 215 | 225 | 215 | 130 |
|  | Transmission loss (dB/m) | | −26 | −26 | −26 | −28 | −26 | −26 | −27 |

As can be seen from Tables 3 and 4, in the case (Examples 1 to 12) of containing the polymer having a structural unit represented by Formula (1) in the molecule and silica having a silanol group amount of 3% or less, the glass transition temperature was high, the moisture absorption solder heat resistance was also high, and the dielectric loss tangent was low. Furthermore, in the cured products of the resin compositions according to Examples 1 to 12, the increase in dielectric loss tangent due to water absorption was sufficiently suppressed even after a water absorption treatment. From these facts, it can be seen that these resin compositions are resin compositions providing cured products which exhibit low dielectric properties and high heat resistance and can suitably maintain the low dielectric properties even after a water absorption treatment. In the case of containing the polymer having a structural unit represented by Formula (1) in the molecule and silica having a silanol group amount of 3% or less, a resin composition having a high glass transition temperature, high moisture absorption solder heat resistance, and a low dielectric loss tangent was obtained and further a cured product, in which the increase in dielectric loss tangent due to water absorption was sufficiently suppressed even after a water absorption treatment, was obtained when acenaphthylene (Example 2 and the like) or a maleimide compound (Example 9) was used as a curing agent. From this fact, it can be seen that both acenaphthylene and a maleimide compound can be used as a curing agent, and the curing agent is not limited to the one used. In the case of containing the polymer having a structural unit represented by Formula (1) in the molecule and silica having a silanol group amount of 3% or less, a resin composition having a high glass transition temperature, high moisture absorption solder heat resistance, and a low dielectric loss tangent was obtained and further a cured product, in which the increase in dielectric loss tangent due to water absorption was sufficiently suppressed even after a water absorption treatment, was obtained when a styrene-based elastomer (Example 10) or a modified PPE (Examples 11 and 12) was used concurrently. From this fact, it can be seen that it is preferable to use a styrene-based elastomer or a modified PPE concurrently.

On the other hand, in the case of containing silica having a silanol group amount of more than 3% (Comparative Examples 1 to 6), the dielectric loss tangent was higher and the amount of change in dielectric loss tangent due to water absorption was also larger as compared with those in Examples 1 to 12.

In the case of not containing the polymer but containing a butadiene-styrene oligomer (Comparative Example 7), the glass transition temperature was lower and the moisture absorption solder heat resistance was also lower as compared with those in Examples 1 to 12.

Next, a film with resin was obtained as follows.

Each of the varnish-like resin compositions (varnishes) according to Example 2 and Comparative Example 2 was applied to a polyethylene terephthalate (PET) film and heated and dried at 110° C. for 3 minutes, thereby fabricating a film with resin. In this film with resin, the resin layer laminated on the PET film was the resin composition. This resin composition was a resin composition before being cured, and was a semi-cured product of the resin composition even if this resin composition was cured.

The film with resin was immersed in chloroform and subjected to ultrasonic cleaning for 30 minutes under the condition of a frequency of 28 kHz. By this ultrasonic cleaning, the inorganic filler contained in the resin layer (the resin composition) was extracted from the resin layer of the film with resin into chloroform. The inorganic filler was then isolated from the chloroform into which the inorganic filler was extracted by filtration and dried. By doing so, the inorganic filler was extracted from the resin compositions according to Example 2 and Comparative Example 2.

The silanol group amount in the inorganic filler extracted from the resin composition according to Example 2 was measured by the method described above. As a result, the silanol group amount was 1.3%.

The silanol group amount in the inorganic filler extracted from the resin composition according to Comparative Example 2 was measured by the method described above. As a result, the silanol group amount was 4.2%.

From this fact, in the case of a resin composition containing a polymer having a structural unit represented by Formula (1) in the molecule and an inorganic filler, in which the inorganic filler contained silica and the silanol group amount in the inorganic filler extracted from the resin composition was 3% or less (Example 2), a cured product was obtained, in which the dielectric loss tangent was lower and the increase in dielectric loss tangent due to water absorption was further suppressed even after a water absorption treatment as compared with those in the case where the silanol group amount in the extracted inorganic filler was more than 3% (Comparative Example 2).

This application is based on Japanese Patent Application No. 2019-145498 filed on Aug. 7, 2019, the contents of which are included in the present application.

In order to express the present invention, the present invention has been described above appropriately and sufficiently through the embodiments. However, it should be recognized by those skilled in the art that changes and/or improvements of the above-described embodiments can be readily made. Accordingly, changes or improvements made by those skilled in the art shall be construed as being included in the scope of the claims unless otherwise the changes or improvements are at the level which departs from the scope of the appended claims.

INDUSTRIAL APPLICABILITY

According to the present invention, provided is a resin composition providing a cured product which exhibits low dielectric properties and high heat resistance and can suitably maintain the low dielectric properties even after a water absorption treatment. In addition, according to the present invention, a prepreg, a film with resin, a metal foil with resin, a metal-clad laminate, and a wiring board which are obtained using the resin composition are provided.

The invention claimed is:

1. A resin composition comprising:
a polymer having a structural unit represented by the following Formula (1); and
an inorganic filler,
wherein the inorganic filler contains silica produced by performing a surface treatment to silica contained in a silica sol so that a ratio of a number of Si atoms contained in silanol groups to a total number of Si atoms is 3% or less:

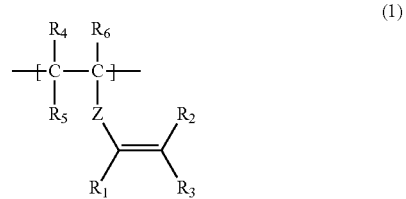

(wherein in Formula (1), Z represents an arylene group, $R_1$ to $R_3$ each independently represent a hydrogen atom or an alkyl group, and $R_4$ to $R_6$ each independently represent a hydrogen atom or an alkyl group having 1 to 6 carbon) atoms.

2. The resin composition according to claim 1, wherein a content of the silica is 10 to 400 parts by mass with respect to 100 parts by mass of components other than the inorganic filler in the resin composition.

3. The resin composition according to claim 1, wherein the structural unit represented by Formula (1) includes a structural unit represented by the following Formula (2):

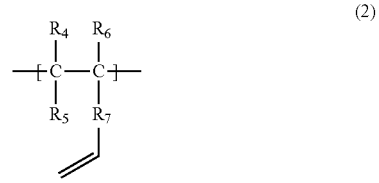

(wherein in Formula (2), $R_4$ to $R_6$ each independently represent a hydrogen atom or an alkyl group having 1 to 6 carbon atoms and $R_7$ represents an arylene group having 6 to 12 carbon) atoms.

4. The resin composition according to claim 3, wherein the structural unit represented by Formula (2) includes a structural unit represented by the following Formula (3):

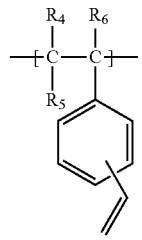

(3)

(wherein in Formula (3), $R_4$ to $R_6$ each independently represent a hydrogen atom or an alkyl group having 1 to 6 carbon) atoms.

5. The resin composition according to claim 1, wherein the polymer has a structural unit represented by the following Formula (4):

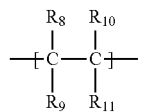

(4)

(wherein in Formula (4), $R_8$ to $R_{10}$ each independently represent a hydrogen atom or an alkyl group having 1 to 6 carbon atoms and $R_{11}$ represents an aryl) group.

6. The resin composition according to claim 5, wherein an aryl group in the structural unit represented by Formula (4) has an alkyl group having 1 to 6 carbon atoms.

7. The resin composition according to claim 1, wherein a weight average molecular weight of the polymer is 1,500 to 40,000.

8. The resin composition according to claim 1, wherein an equivalent of a vinyl group contained in the structural unit represented by Formula (1), where $R_1$ to $R_3$ are a hydrogen atom, of the polymer is 250 to 1200.

9. The resin composition according to claim 1, wherein a content of the polymer is 10 to 95 parts by mass with respect to 100 parts by mass of components other than the inorganic filler in the resin composition.

10. The resin composition according to claim 1, further comprising a modified polyphenylene ether compound of which a terminal is modified with a substituent having a carbon-carbon unsaturated double bond.

11. The resin composition according to claim 1, further comprising a curing agent,
wherein the curing agent contains at least one selected from the group consisting of a polyfunctional acrylate compound having two or more acryloyl groups, a polyfunctional methacrylate compound having two or more methacryloyl groups, a polyfunctional vinyl compound having two or more vinyl groups, a styrene derivative, an allyl compound, a maleimide compound, an acenaphthylene compound, and an isocyanurate compound.

12. The resin composition according to claim 11, wherein a content of the curing agent is 5 to 50 parts by mass with respect to 100 parts by mass of components other than the inorganic filler in the resin composition.

13. A prepreg comprising:
the resin composition according to claim 1 or a semi-cured product of the resin composition; and
a fibrous base material.

14. A film with resin comprising:
a resin layer containing the resin composition according to claim 1 or a semi-cured product of the resin composition; and
a support film.

15. A metal foil with resin comprising:
a resin layer containing the resin composition according to claim 1 or a semi-cured product of the resin composition; and
a metal foil.

16. A metal-clad laminate comprising:
an insulating layer containing a cured product of the resin composition according to claim 1; and
a metal foil.

17. A wiring board comprising:
an insulating layer containing a cured product of the resin composition according to claim 1; and
wiring.

18. A metal-clad laminate comprising:
an insulating layer containing a cured product of the prepreg according to claim 13; and
a metal foil.

19. A wiring board comprising:
an insulating layer containing a cured product of the prepreg according to claim 13; and
wiring.

* * * * *